United States Patent
Nuch et al.

(10) Patent No.: US 8,671,961 B2
(45) Date of Patent: Mar. 18, 2014

(54) METHODS AND APPARATUS FOR CLEANING SEMICONDUCTOR WAFERS

(71) Applicant: ACM Research (Shanghai) Inc., Shanghai (CN)

(72) Inventors: Voha Nuch, Shanghai (CN); David Wang, Shanghai (CN); Yue Ma, Shanghai (CN); Fufa Chen, Shanghai (CN); Jian Wang, Shanghai (CN); Yunwen Huang, Shanghai (CN); Liangzhi Xie, Shanghai (CN); Chuan He, Shanghai (CN)

(73) Assignee: ACM Research (Shanghai) Inc. (CN)

( * ) Notice: Subject to any disclaimer, the term of this patent is extended or adjusted under 35 U.S.C. 154(b) by 0 days.

(21) Appl. No.: 14/052,555

(22) Filed: Oct. 11, 2013

(65) Prior Publication Data

US 2014/0034094 A1 Feb. 6, 2014

Related U.S. Application Data

(62) Division of application No. 12/734,983, filed as application No. PCT/CN2007/071210 on Dec. 10, 2007, now Pat. No. 8,580,042.

(51) Int. Cl.
*B08B 3/00* (2006.01)

(52) U.S. Cl.
USPC ........... 134/109; 134/94.1; 134/137; 134/157

(58) Field of Classification Search
None
See application file for complete search history.

(56) References Cited

U.S. PATENT DOCUMENTS

2002/0053319 A1* 5/2002 Nagamine ................. 118/52
2004/0050491 A1* 3/2004 Miya et al. ............ 156/345.11

FOREIGN PATENT DOCUMENTS

JP    10041269 A  *  2/1998

OTHER PUBLICATIONS

English Machine Translation of JP 10-041269 A.*

* cited by examiner

*Primary Examiner* — Nicole Blan
(74) *Attorney, Agent, or Firm* — Howard c. Miskin; Gloria Tsui-Yip

(57) ABSTRACT

An apparatus for cleaning and conditioning the surface of a semiconductor substrate such as wafer includes a rotatable chuck, a chamber, a rotatable tray for collecting cleaning solution with one or more drain outlets, multiple receptors for collecting multiple cleaning solutions, a first motor to drive chuck, and a second motor to drive the tray. The drain outlet in the tray can be positioned directly above its designated receptor located under the drain outlet. The cleaning solution collected by the tray can be guided into designated receptor. One characteristic of the apparatus is having a robust and precisely controlled cleaning solution recycle with minimum cross contamination.

9 Claims, 25 Drawing Sheets

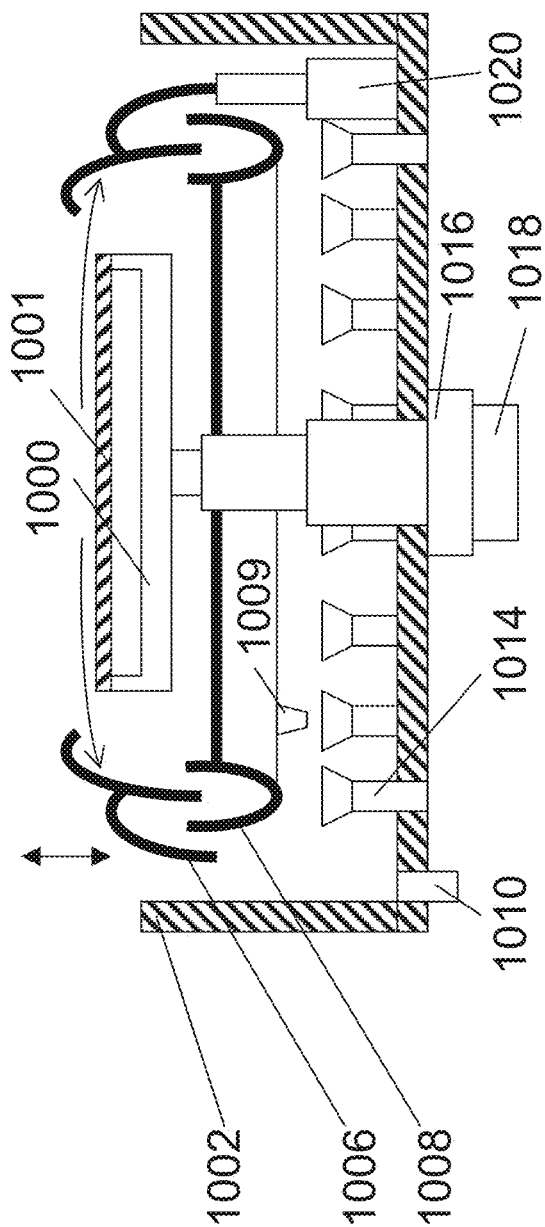

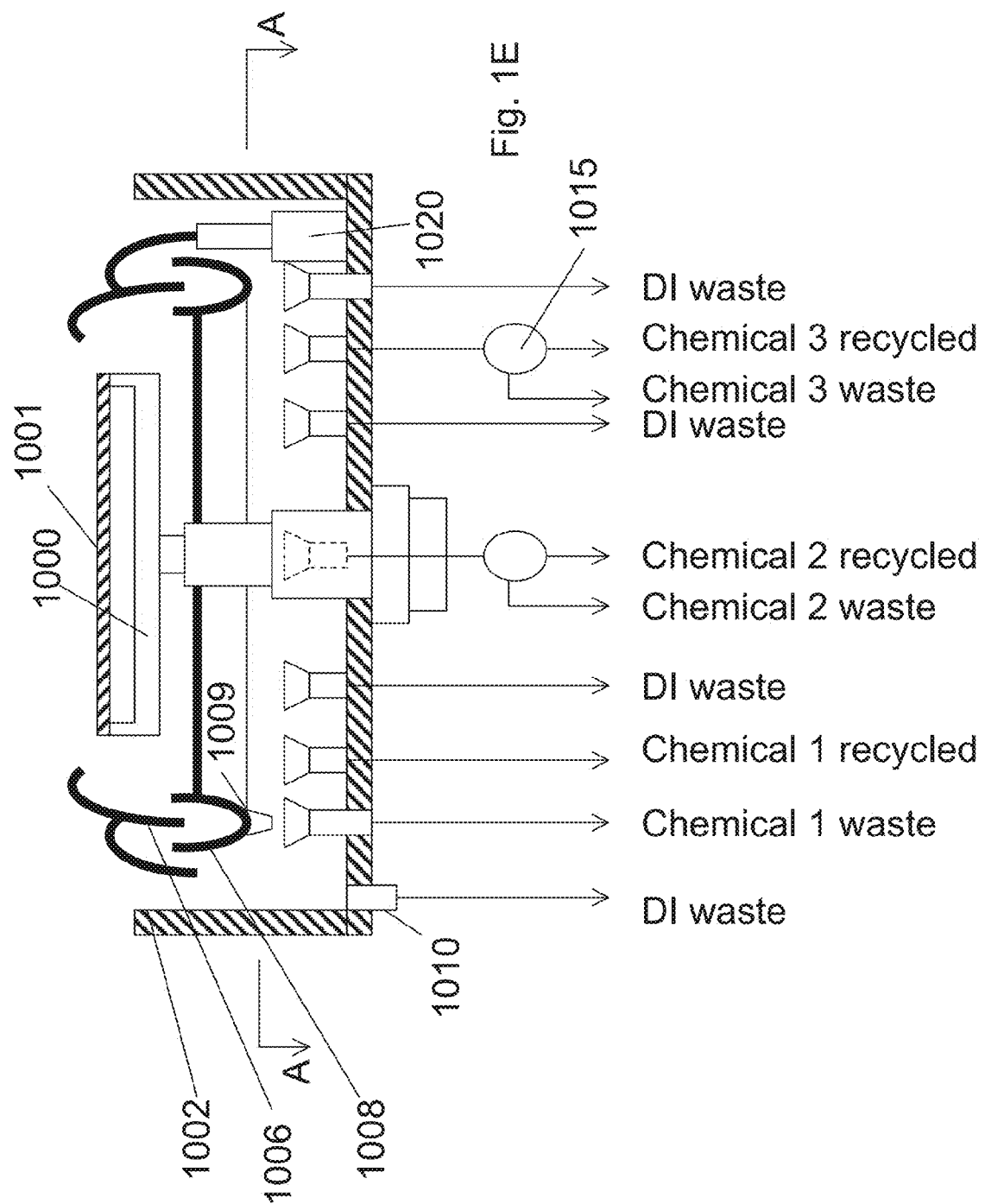

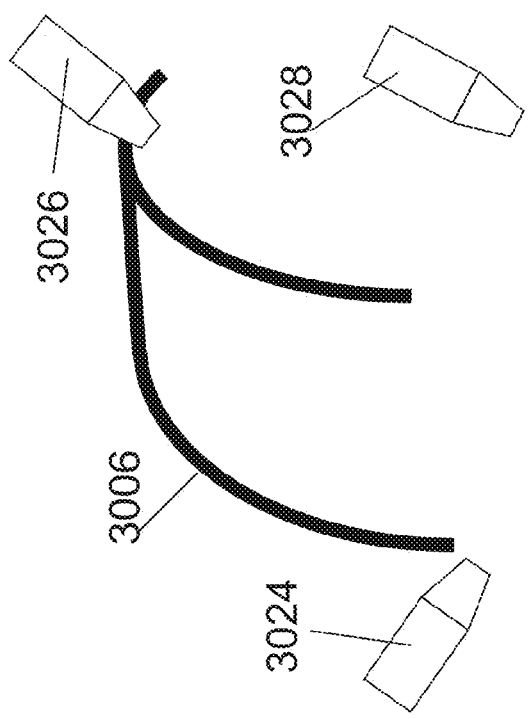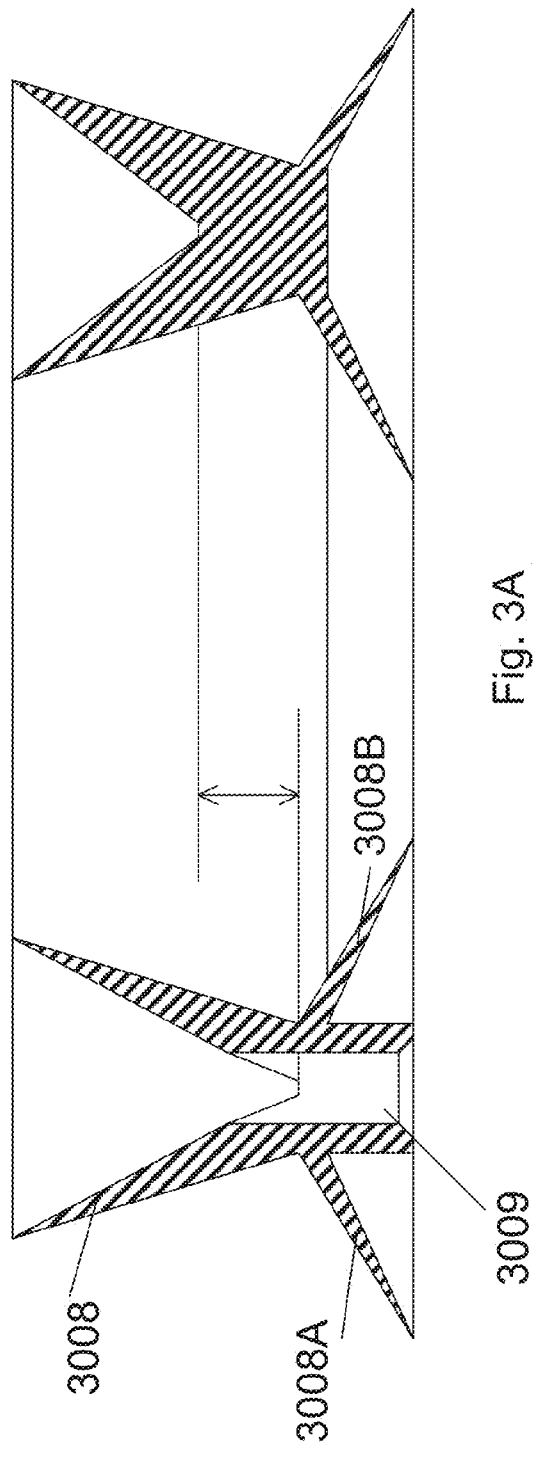
Fig. 3A

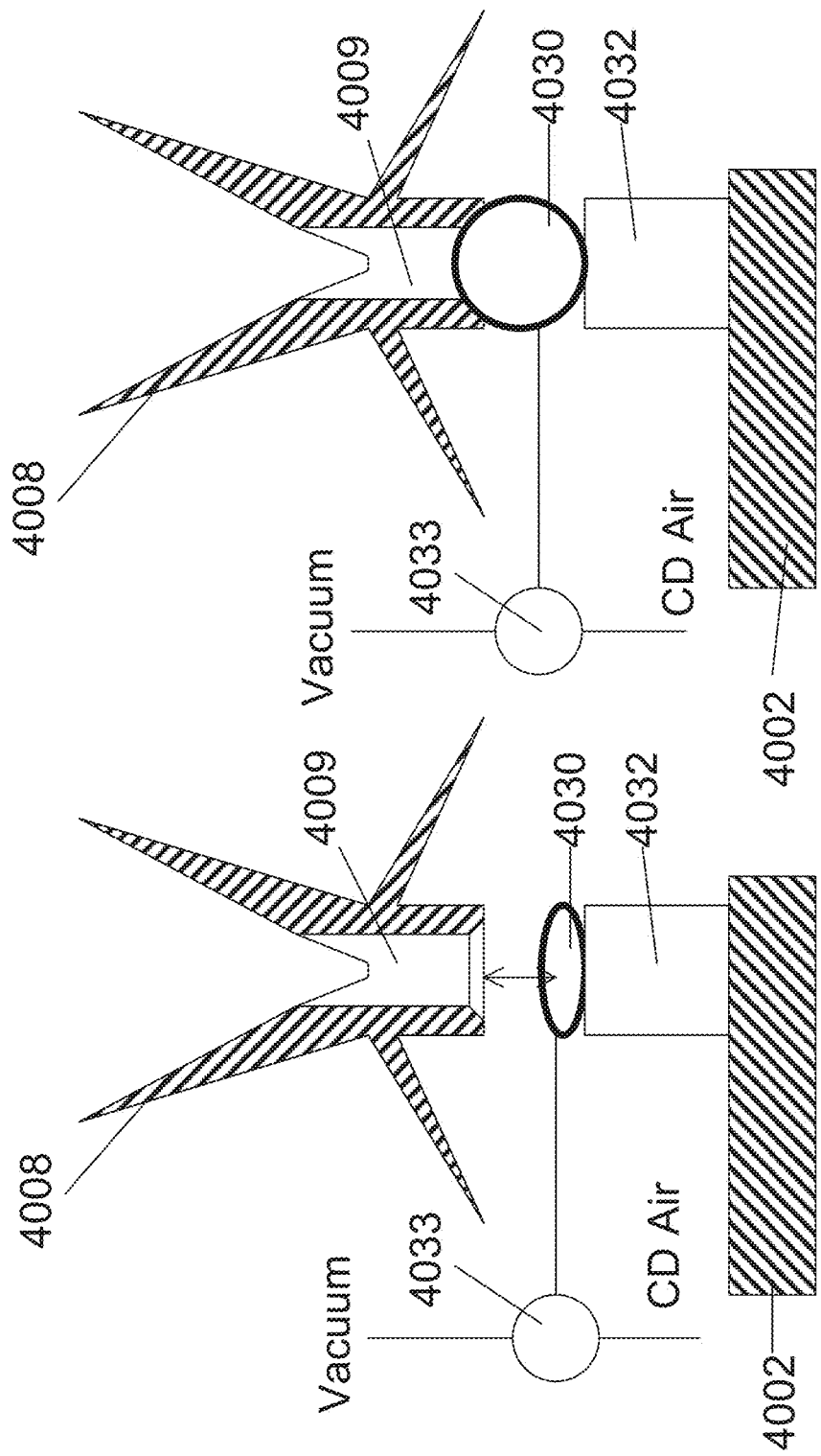

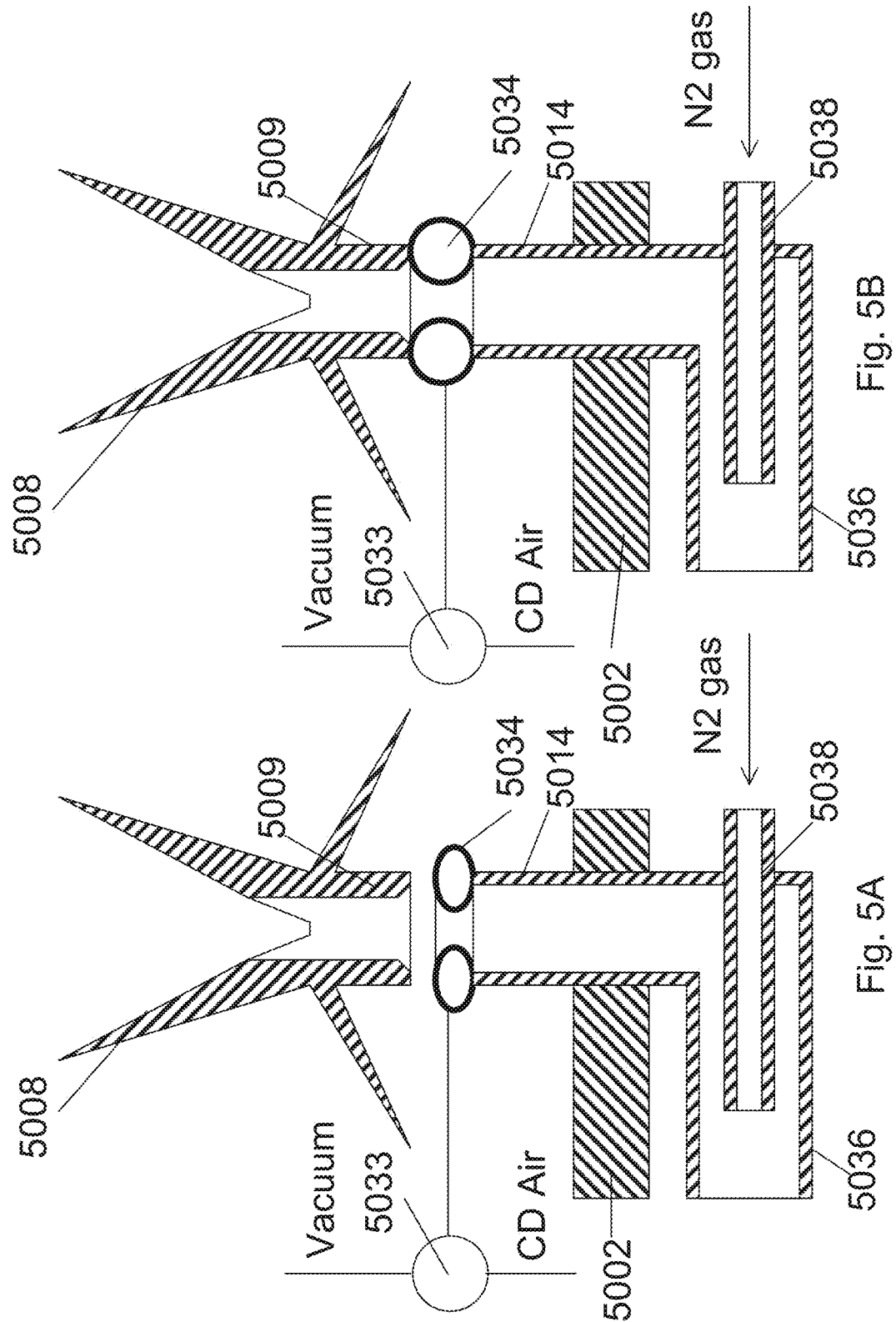

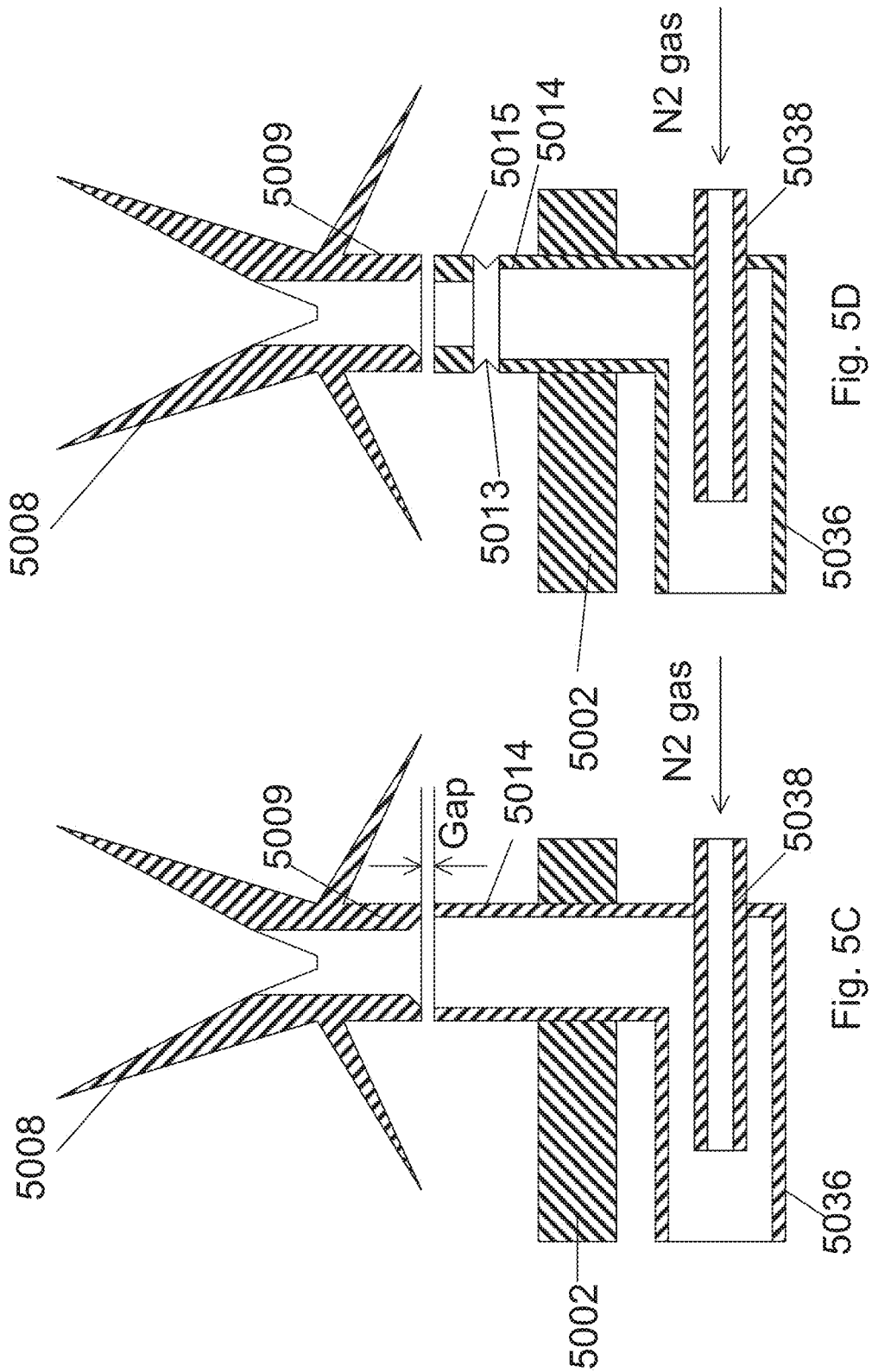

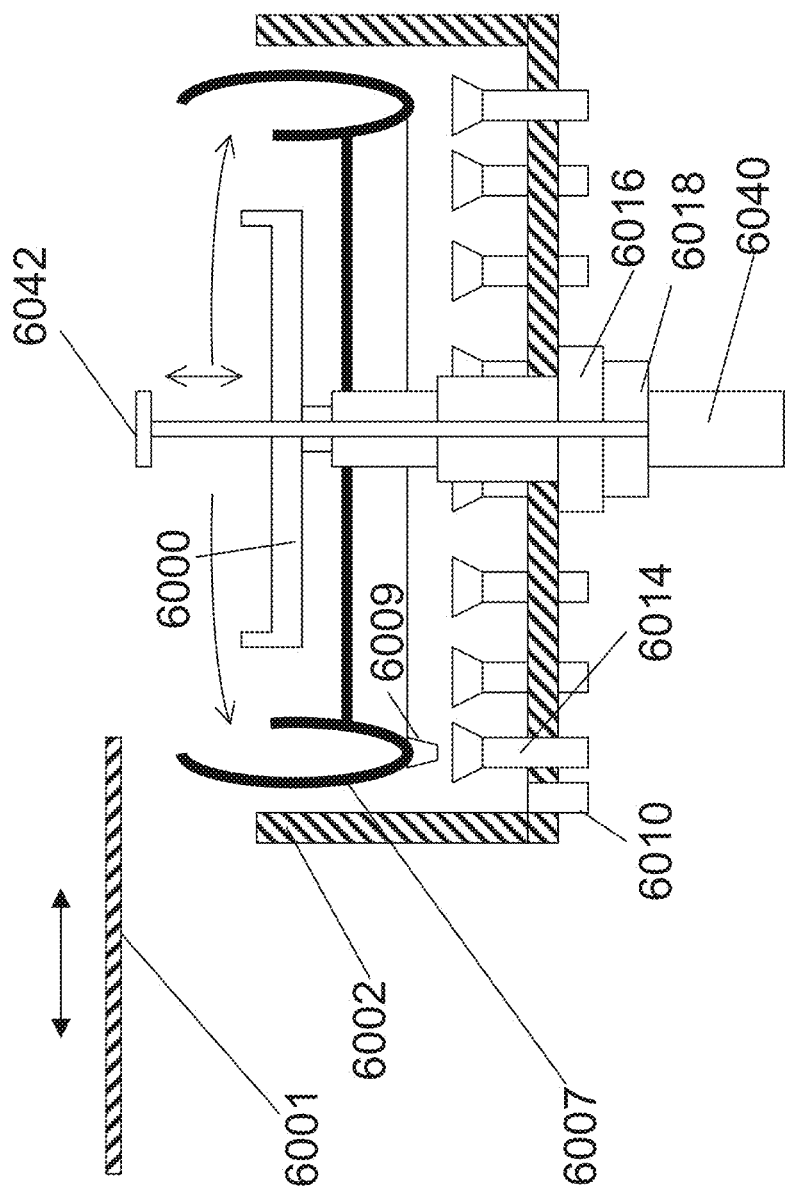

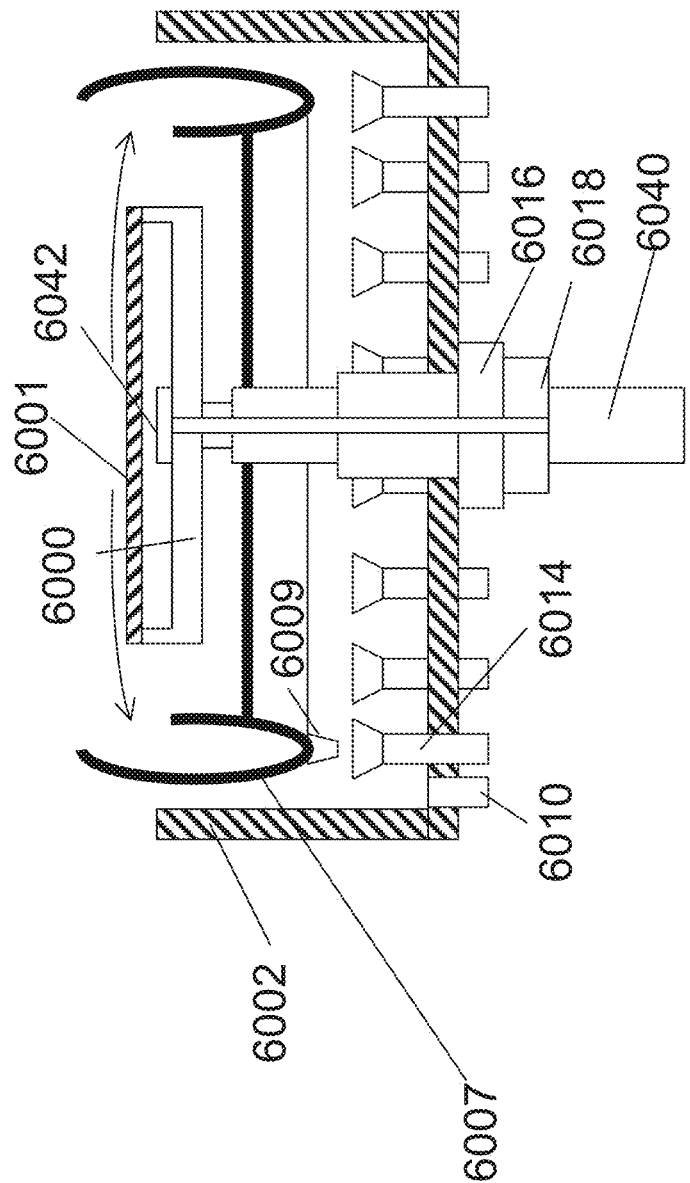

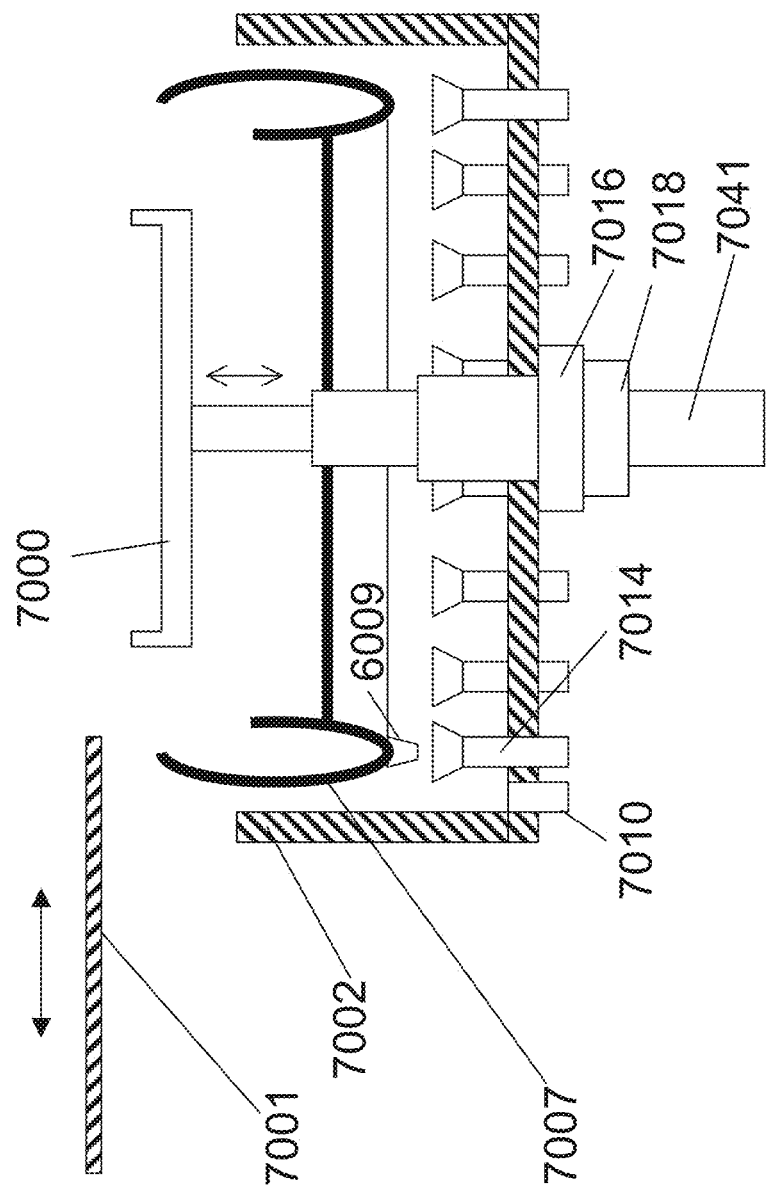

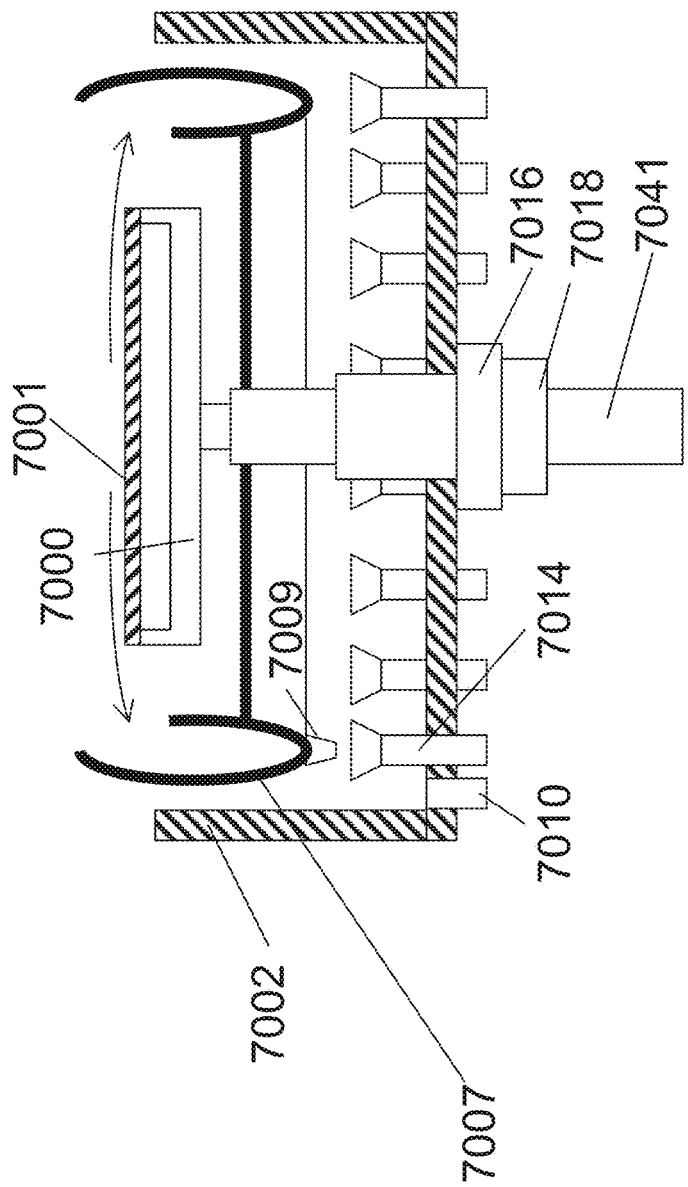

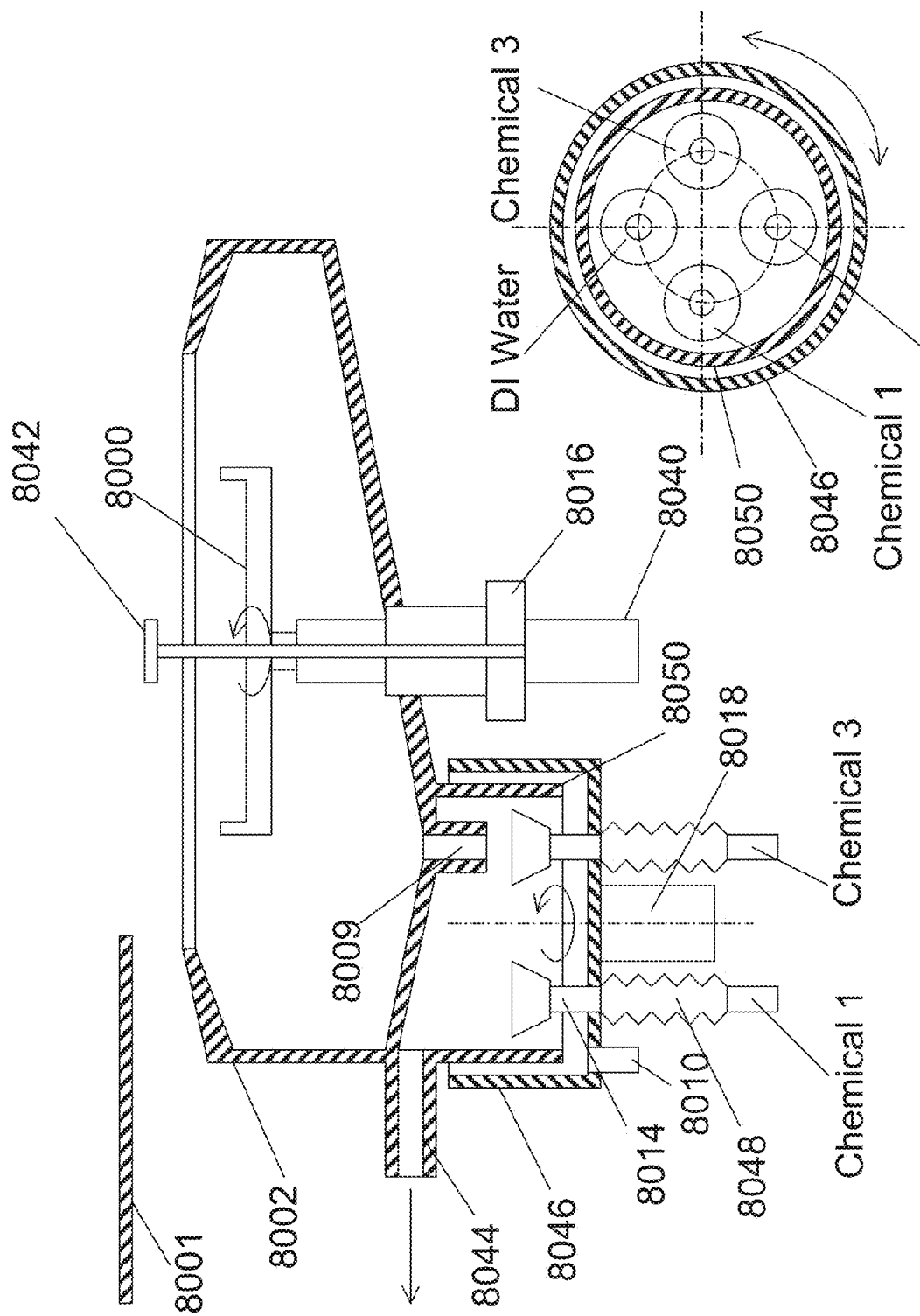

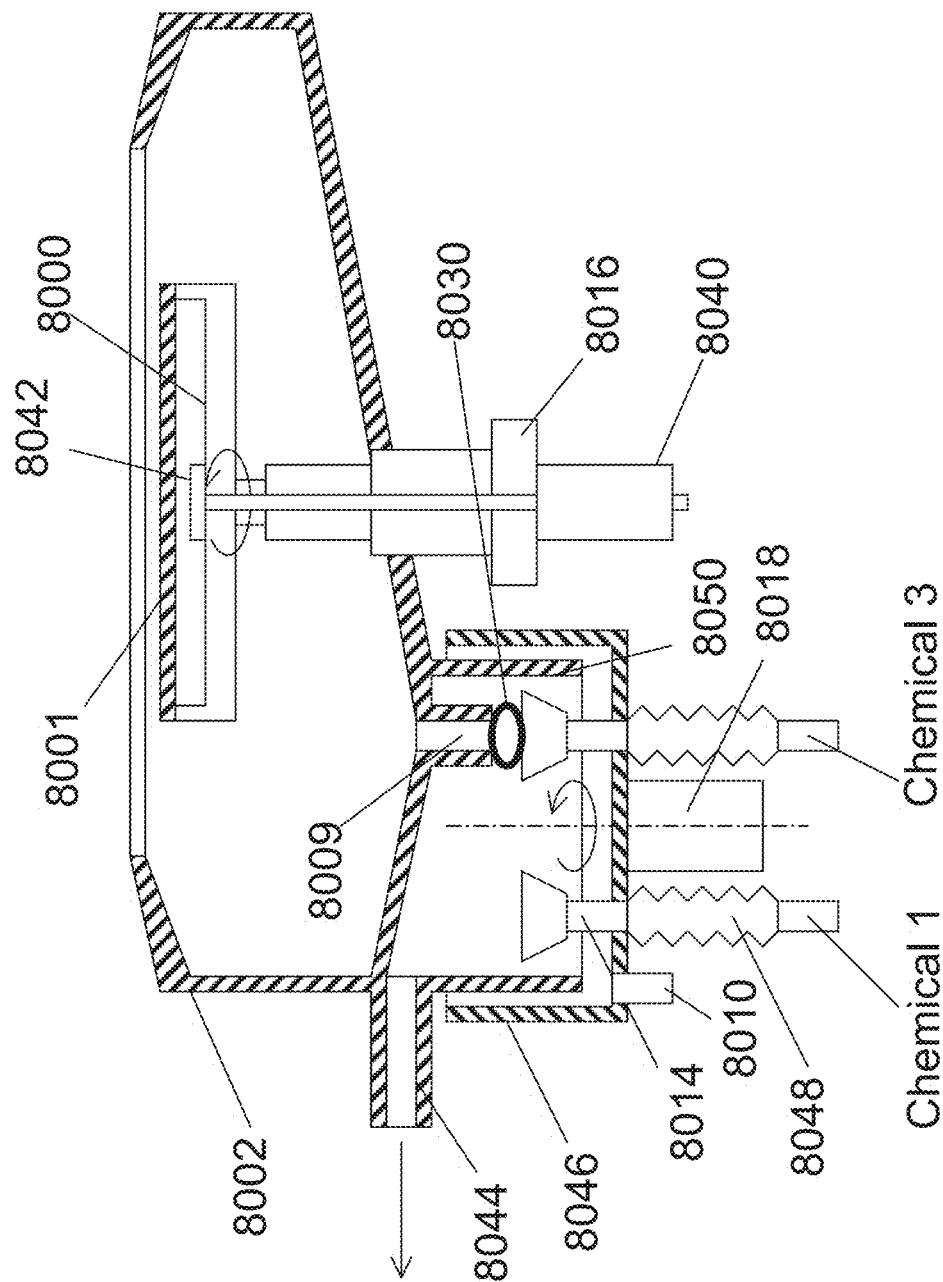

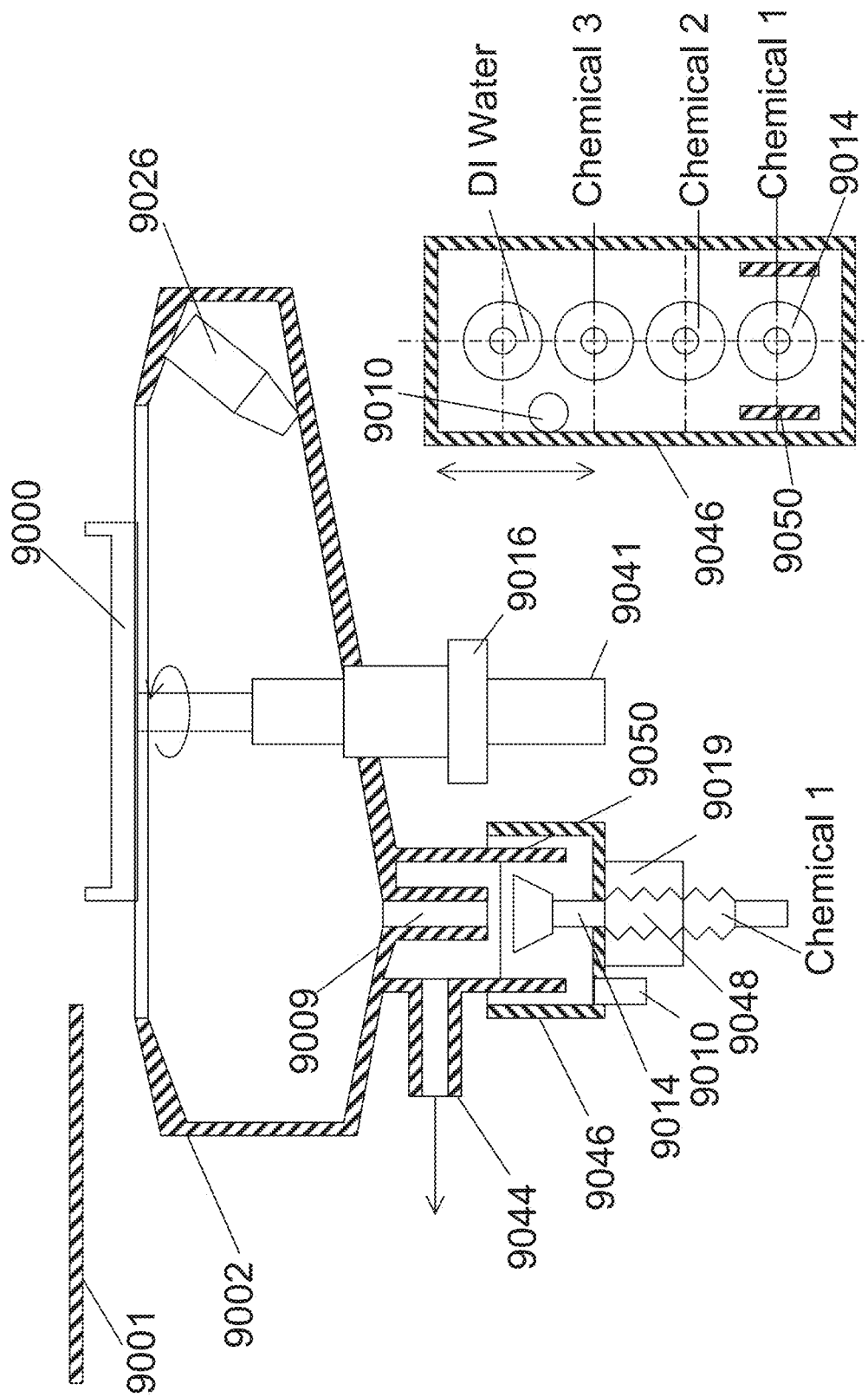

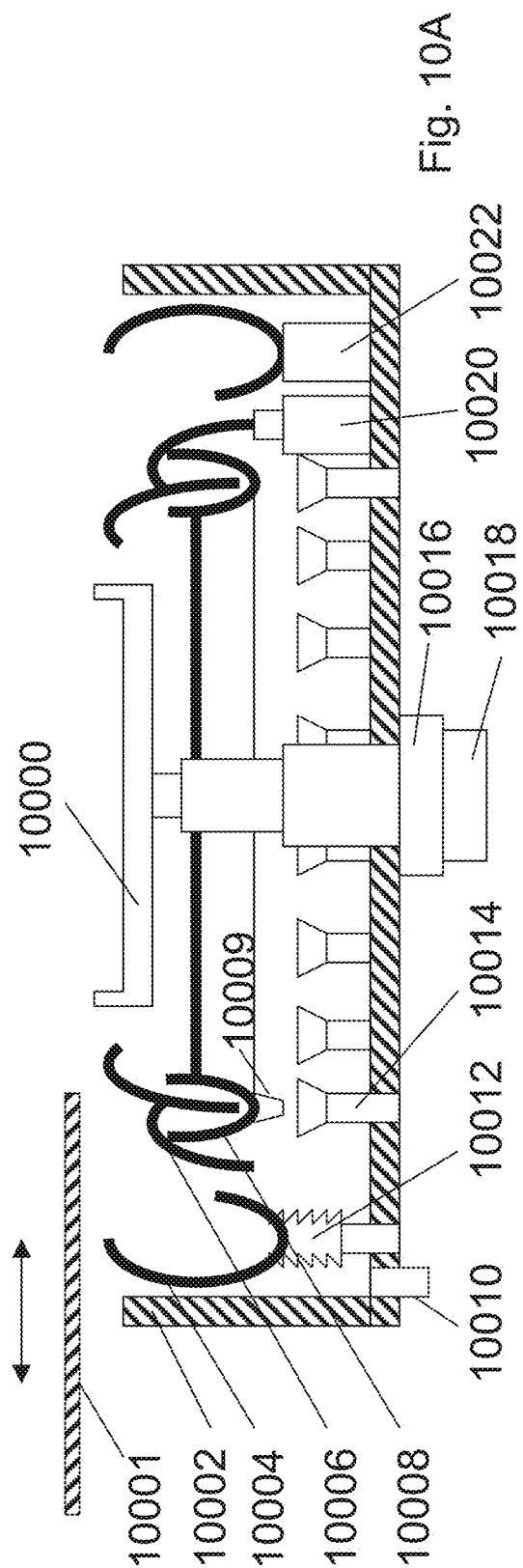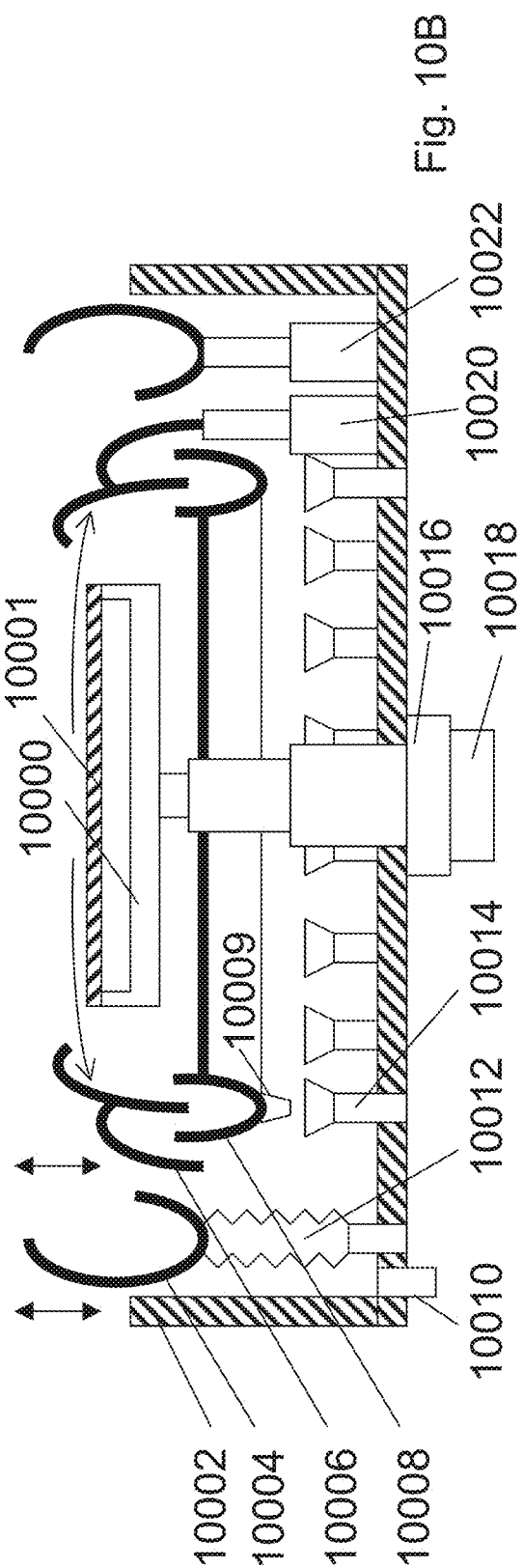

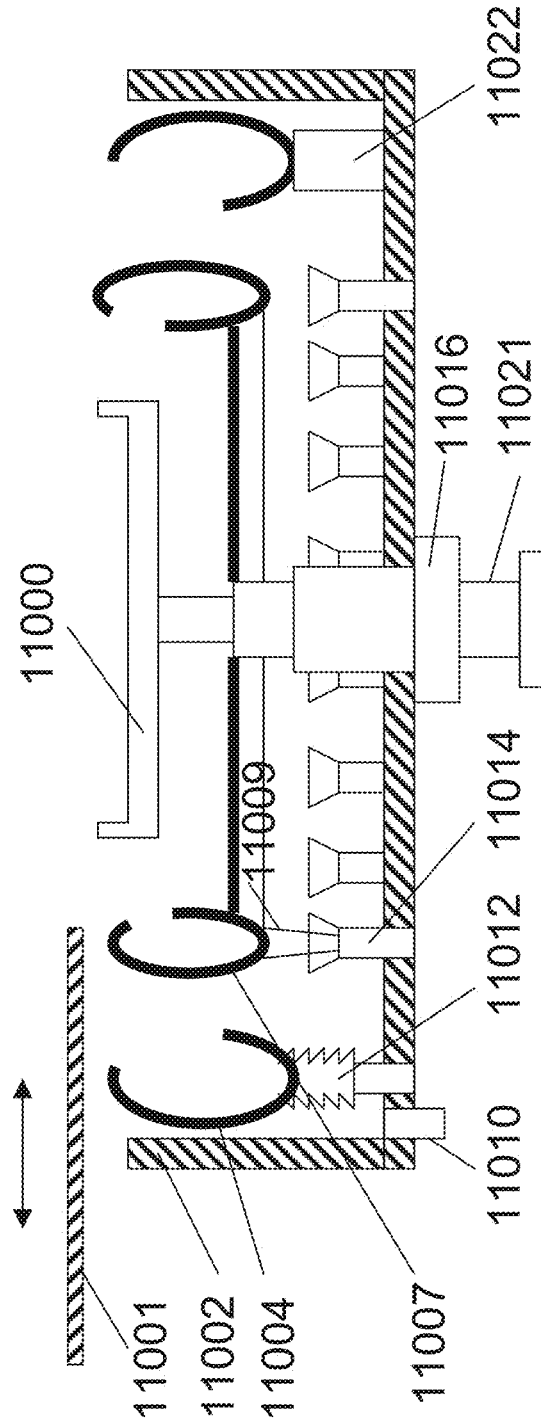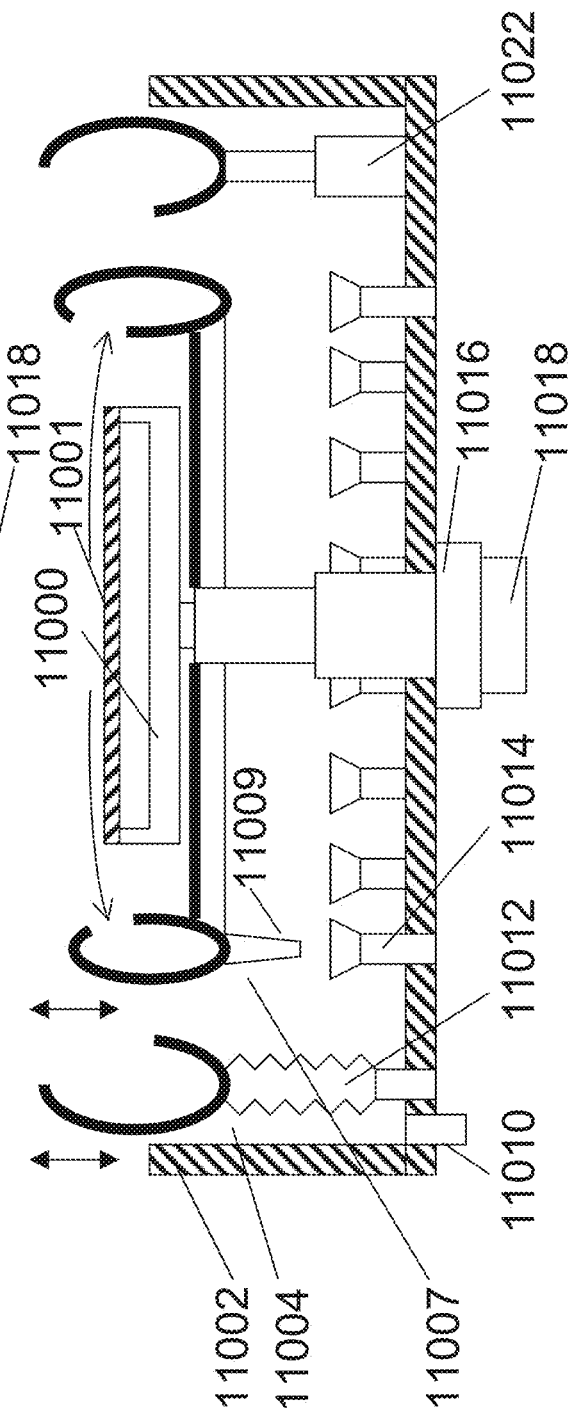

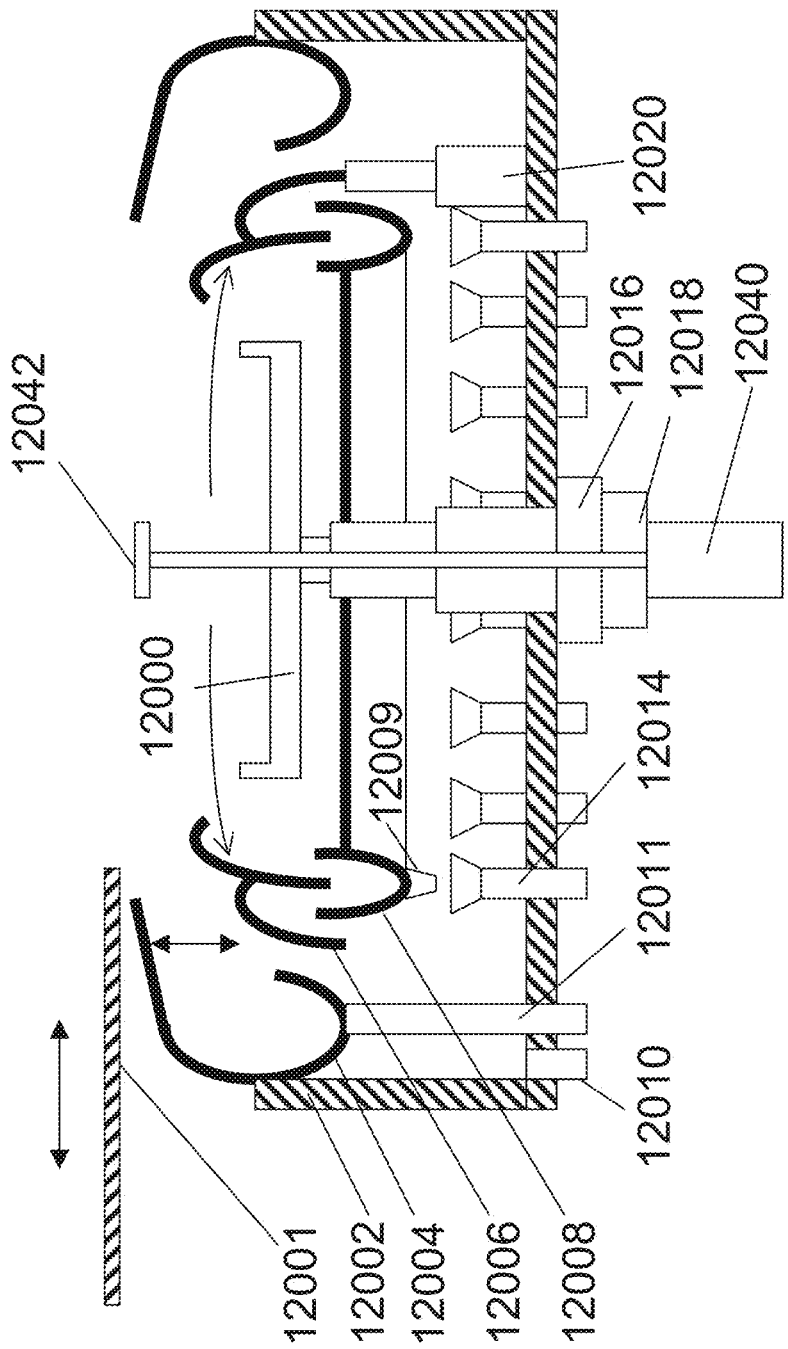

METHODS AND APPARATUS FOR CLEANING SEMICONDUCTOR WAFERS

CROSS-REFERENCE TO RELATED APPLICATION

This is a divisional application of pending application Ser. No. 12/734,983 filed on Jan. 18, 2011, which is hereby incorporated by reference.

FIELD OF THE INVENTION

The present invention generally relates to a method and an apparatus for wet cleaning and conditioning the surface of semiconductor wafer, more particularly, to a method and an apparatus using a tray coupled with a drain outlet to distribute multiple cleaning solutions into separated return pipes for recycling or reclaiming cleaning solutions with minimal cross contamination between cleaning solutions.

BACKGROUND OF THE INVENTION

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the semiconductor transistors and desired electronic circuitry to connect those transistor terminals. In particular, multiple masking, ion implantation, annealing, and plasma etching, and chemical and physical vapor deposition steps can be performed to form shallow trench, transistor well, gate, poly-silicon line, and interconnection line structures. In each step, particle and contamination are added on front and backside of the wafer. Those particle and contamination can lead to defects on wafers and subsequently lowering the IC device yield. In order to remove the particle and contamination, wet bench equipments have been used for many years. A wet bench equipment simultaneously processes a batch of wafers (normally 25 wafers) in a polarity of wet baths in a sequential fashion. In between two baths, the processed batch of wafers is rinsed to remove any residue cleaning solution from the previous bath. In a wet bench equipment, flow velocity of the cleaning solution between the separation among wafers is relatively low, thereby the cleaning efficiency, especially for smaller particles, is limited. The queue time for the batch of wafer to transfer from one bath to another is difficult to control as the time requirement for each clean step is different, thereby a high process variation is unavoidable. Furthermore, cross contamination from one wafer to another in the same batch is inherent for a batch process. As wafer size migrates to 300 mm, and manufacture technology node advances to 65 nm and beyond, traditional wet bench approach can no longer effectively and reliably cleaning the particles and contamination from wafer.

Single wafer cleaning equipment has become an alternative choice. Single wafer cleaning equipment processes one wafer a time in a cleaning module, sequentially injecting multiple cleaning solutions onto its surface and applying a deionized (DI) water rinse between cleaning solutions. Single wafer processor gives the benefits to precisely control wafer rotation, cleaning solution dispense time, and eliminate wafer to wafer cross contamination. In order to save cleaning solution, and to reduce cost for waste chemical treatment, It is desired to recycle or reuse those cleaning solutions. However, since all cleaned steps are performed in one cleaning chamber, it is a challenge to recycle or reclaim those cleaning solutions without cross contamination at part per million (ppm) level. The less the cross contamination, the less impact it does to the cleaning process and the longer the lifetime of the cleaning solution is.

It is desired to have a robust and precisely controlled cleaning solution recycle or reclaim method for reducing chemical cross contamination, and therefore to extend the life time of recycled or reclaimed cleaning solution.

SUMMARY OF THE INVENTION

One embodiment of the present invention is to disclose cleaning chamber with a rotating tray having a drain outlet. The tray is rotated around its central axis by a motor so that the drain outlet will be moved to its designated receptor located under the rotating tray. The cleaning solution collected by the tray can be guided into the designated receptor by positioning the outlet directly above it.

Another embodiment of the present invention is to disclose a cleaning chamber with a tray having multiple receptors to collect cleaning solutions. The tray is rotated around its central axis so that the drain outlet of the chamber is selectively aligned above each of the receptors of the tray. The cleaning solution collected by the cleaning chamber can be guided into the designated receptor by positioning the receptor directly under the drain outlet of the chamber.

Another embodiment of the present invention is to disclose a cleaning chamber with a tray having multiple receptors to collect cleaning solutions. The tray is moved laterally by a translational motion mechanism so that the drain outlet of the chamber can be selectively aligned above each of the receptors of the tray. The cleaning solution collected by the cleaning chamber can be guided into the receptor by positioning the receptor directly under the drain outlet of the chamber.

Another embodiment of the present invention is to disclose a drain outlet having quick dump capability. The space between the drain outlet and receptor can be sealed by an air inflated seal, and the rinsing water inside the tray can be quickly pumped away by a pump connected to the receptor.

BRIEF DESCRIPTION OF THE DRAWINGS

FIGS. 1A-1F depict an exemplary wafer cleaning device;

FIGS. 3A-3B depict a tray in wafer cleaning device;

FIGS. 4A-4E depicts a tray and an air inflated seal, and simulation results in wafer cleaning device;

FIGS. 5A-5D depict another tray and seal in wafer cleaning device;

FIGS. 6A-6B depict another exemplary wafer cleaning device;

FIGS. 7A-7B depict another exemplary wafer cleaning device;

FIGS. 8A-8C depict another exemplary wafer cleaning device;

FIGS. 9A-9B depict another exemplary wafer cleaning device;

FIGS. 10A-10B depict another exemplary wafer cleaning device;

FIGS. 11A-11B depict another exemplary wafer cleaning device;

FIGS. 12A-12B depict another exemplary wafer cleaning device;

DETAILED DESCRIPTION OF THE PREFERRED EMBODIMENTS

Figure 1A:
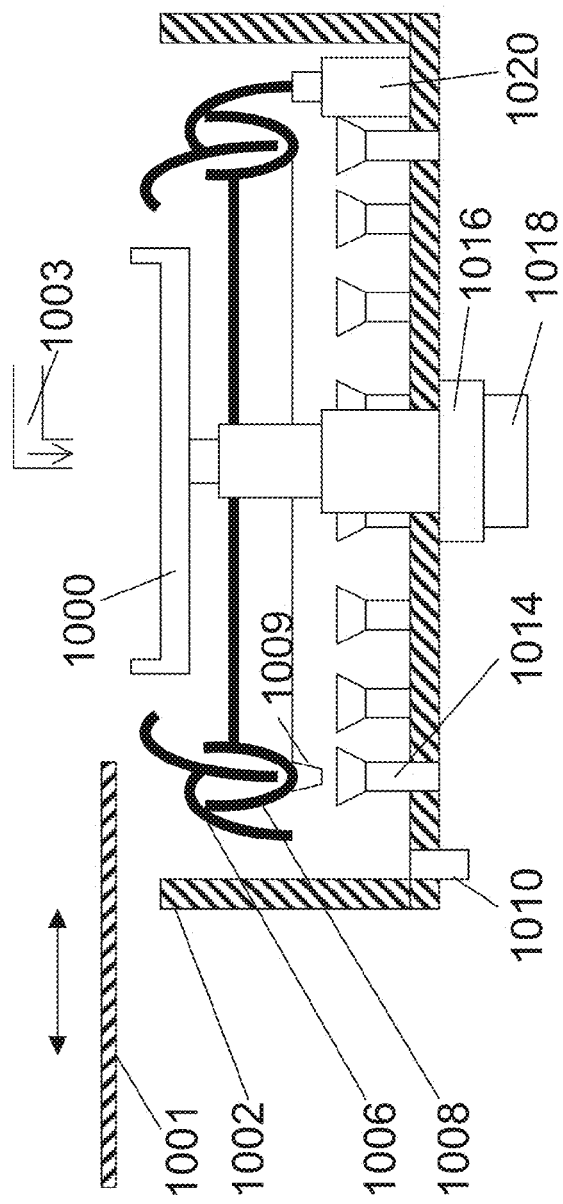

While the present invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

It is often desired that the surface of the semiconductor substrate is conditioned to specific properties after it is cleaned. An example is to modify the surface to be hydrophilic during post chemical mechanical polish cleaning of the dielectric or metal layers. Surface conditioning agents are often added into a cleaning solution so that both cleaning and surface conditioning can be achieved in a single process step. In the present invention, cleaning and conditioning of the semiconductor substrate surface can be done with either one combined solution or separate solutions. In the following paragraphs, words "cleaning solution" are used in reference to the liquid or liquid mixtures that lead to the effect of material removal from the surface, conditioning the surface to desired properties, or both.

FIGS. 1A to 1E show the details of an exemplary embodiment of the semiconductor substrate or wafer cleaning device using a rotatable tray in accordance with the present invention. The wafer cleaning device comprises a wafer chuck 1000 rotated by a first rotation drive mechanism 1016, a chamber 1002, a tray 1008 with a drain outlet 1009 being rotated by a second rotation drive mechanism 1018, a shroud 1006 to intercept the used cleaning solution from a spinning wafer 1001 and guide it into tray 1008, multiple cleaning solution receptors 1014, and an actuator 1020 to drive shroud 1006 up and down. Cleaning solution receptor 1004 and drain outlet 1009 of tray 1008 are able to be aligned by rotating tray 1008. Chamber 1002 has a discharging outlet 1010 to discharging the waste cleaning solution. The semiconductor substrate cleaning device shown in FIG. 1A is equipped with but not limited to a nozzle 1003 to injecting a cleaning solution.

It should be understood that tray 1008 may be configured to intercept the used cleaning solution or not all of the used cleaning solution should be collected, and shroud 1006 illustrated in FIGS. 1A to 1E is optional. In an alternative embodiment, tray 1008 and chuck 1000 may rotate around a coaxial line or two different axes respectively, and actuator 1020 may be a cylinder. In another alternative embodiment, the semiconductor substrate cleaning device may comprise one cleaning solution receptor 1014 for recycling or reclaiming only one kind of cleaning solution.

The whole cleaning process of cleaning a wafer 1001 using the cleaning device shown in the FIG. 1A-FIG. 1E comprises the following steps:

Loading a semiconductor substrate 1001 onto the chuck 1000 by a robot; performing at least one cleaning cycle using at least one kind of clean solution; dry semiconductor substrate 1001; and unloading semiconductor substrate 1001 from chuck 1000; where on the assumption that N kind or kinds of cleaning solution should be used in the whole cleaning process, the cleaning cycle comprises following steps, where N and I are integer and N>0, 0<I≤N.

According to the present invention, a plurality of cleaning solutions may be used for cleaning the wafer, and for each kind of clean solution, a cleaning cycle is applied. The cleaning cycle for the $I^{th}$ cleaning solution comprises:

moving drain outlet 1009 of tray 1008 to align to receptor 1014 for collecting the $I^{th}$ cleaning solution, where the drain outlet 1009 is preferably positioned directly above receptor 1014; injecting the $I^{th}$ cleaning solution onto the semiconductor substrate for a pre-set time $t_1$; stopping injecting the $I^{th}$ cleaning solution.

According to one embodiment, the cleaning cycle further comprises: moving drain outlet 1009 of tray 1008 to align to a receptor 1014 for collecting the $I^{th}$ cleaning solution waste; injecting a rinsing liquid onto semiconductor substrate 1001 for a pre-set time; and stopping injecting the rinsing liquid.

Figure 1B:
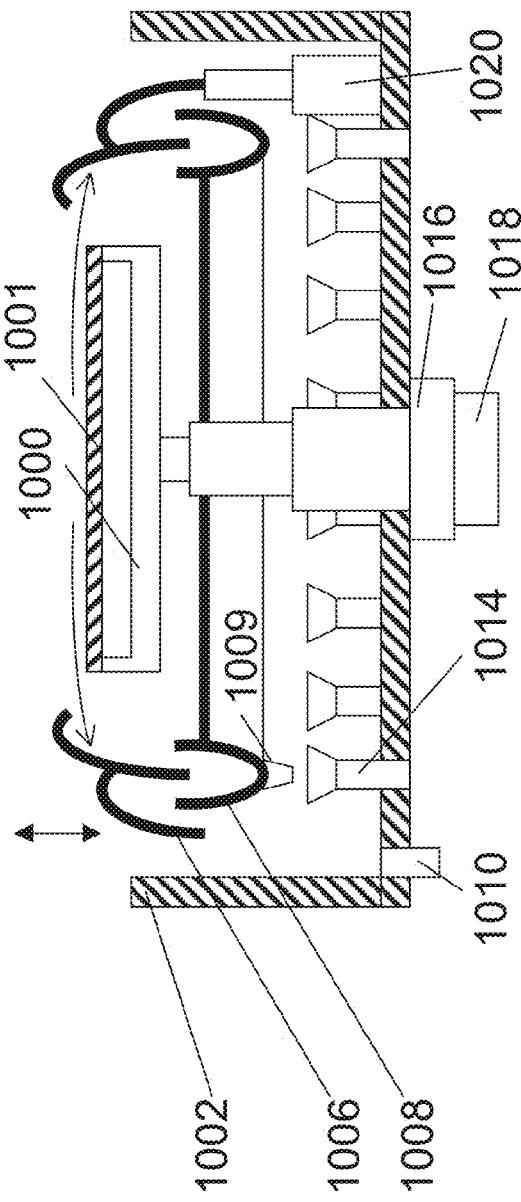

An example of cleaning a wafer 1001 in regular sequence is provided as follows, where N=2:

First, moving shroud 1006 to a low position by actuator 1020; loading wafer 1001 onto chuck 1000 by a robot (not shown), as shown in FIG. 1A; and moving shroud 1008 to a high position, as shown in FIG. 1B.

Second, performing a first cleaning cycle using the first kind of cleaning solution, comprising: rotating chuck 1000 by a first rotation drive mechanism 1016, and rotating tray 1008 by a second rotation drive mechanism 1018 to make drain outlet 1009 of tray 1008 directly above one of receptors 104 for collecting the first cleaning solution, as shown in FIG. 1B. Injecting the first cleaning solution through nozzle 1003 onto wafer 1001 for a pre-set cleaning time, here the first cleaning solution left from spinning wafer 1001 being collected by shroud 1006, then flowing down to tray 1008 and being collected in tray 1008, and finally being drained to receptor 1014 through outlet drain 1009. Stopping injecting the first cleaning solution. Rotating tray 1008 to make drain outlet 1009 directly above another receptor 1014 for collecting waste cleaning solution, as shown in FIG. 1C. Injecting dionized water (DI) on wafer 1001 for a pre-set cleaning time, here the dionized water left from wafer 1001 being collected by shroud 1006, then reaching tray 1008, then flowing into receptor 1014 through outlet drain 1009. Stopping injecting DI water. For completely remove the first cleaning solution from the outlet drain, the cleaning cycle of the present invention may also comprises a rinsing cycle, which will be described in detail below.

Third, performing a second cleaning cycle for a second cleaning solution, comprising: rotating tray 1008 to make drain outlet 1009 directly above still another receptor 1014 for collecting second cleaning solution, as shown in FIG. 1D. Injecting the second cleaning solution for a pre-set cleaning time. Stopping injecting the second cleaning solution. Rotating tray 1008 to make drain outlet 1009 directly above yet another receptor 1014 for collecting the waste second cleaning solution, as shown in FIG. 1C. Injecting DI water on wafer 1001 for a pre-set cleaning time, and then stopping injecting DI water.

Fourth, spin-drying wafer 1001 and moving shroud 1006 to a lower position;

Fifth, unloading wafer 1001 by the robot from chuck 1000.

One advantage of the cleaning device according to the present invention is that multiple cleaning solutions can be recycled or reclaimed without the increase of the size of cleaning chamber 1002. In above process steps, solutions consisting of chemical species other than DI water, such as surfactants solution can be used as replacement to DI water for wafer cleaning and rinsing. Also, DI water used in the above-mentioned cleaning sequences can be pre-mixed with carbon dioxide gas or other gases to enhance the cleaning efficiency. The temperature of DI water is preferably in the range from 20 to 90° C.

In one embodiment, the cleaning solutions for cleaning semiconductor substrate or wafer using the cleaning device of present invention include but not limited to the following:
1. $H_2SO_4:H_2O_2=4:1$, temperature range: 120 to 150° C.;
2. $HF:H_2O=1$: (50 to 1000), temperature range: 20 to 25° C.
3. $NH_4OH:H_2O_2:H_2O=1$:(1 to 2):(5 to 100), temperature range: 25 to 70° C.
4. $HCl:H_2O_2:H_2O=1:1$:(5 to 100), temperature range: 25 to 75° C.

Figure 1F:
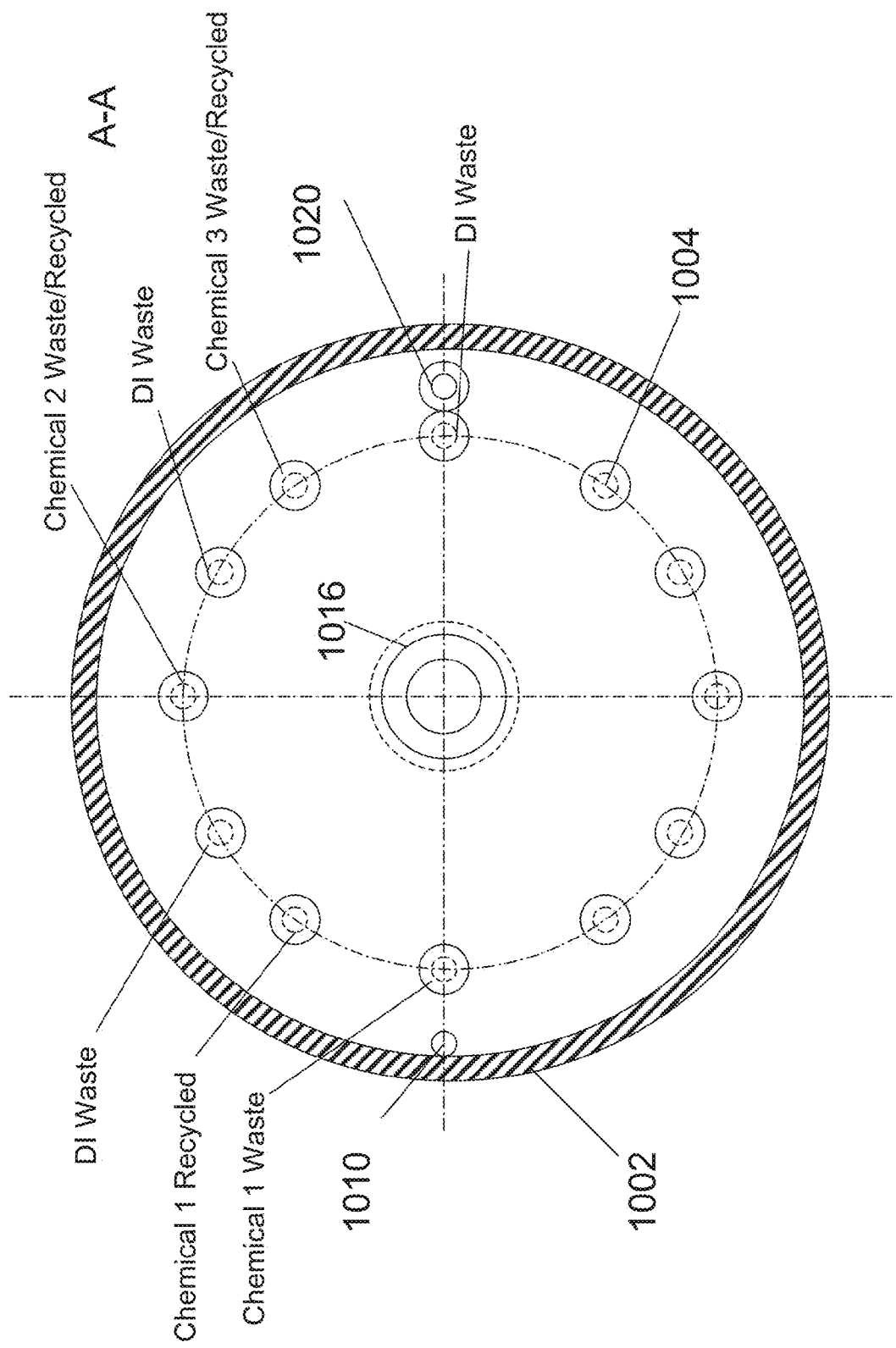

In order to keep the purity of a cleaning solution high, it is desired to only recycle or reclaim a cleaning solution partially, generally speaking, the first part of the used cleaning solution may not be recycled or reclaimed. The working process steps for recycling or reclaiming partial cleaning solution is similar to the above-mentioned steps, except that the cleaning cycle is a bit different, the cleaning cycle using the $I^{th}$ cleaning solution under this condition comprises:

Rotating drain outlet 1009 of tray 1008 to position drain outlet 1009 directly above a receptor 1014 for collecting the $I^{th}$ cleaning solution waste as shown in FIG. 1E and FIG. 1F. Inject the $I^{th}$ cleaning solution for a pre-set time $t_1$. The pre-set time $t_1$ depends on how much cleaning solution is need to be dumped or thrown away. Rotating drain outlet 1009 of tray 1008 to position drain outlet 1009 directly above another receptor 1014 for collecting and recycling the $I^{th}$ cleaning solution, shown in FIG. 1E. Continuing to inject the $I^{th}$ cleaning solution for a second pre-set time $t_2$. The second pre-set time $t_2$ depends on how much cleaning solution is needed to be recycled or reclaimed.

The relationship between $t_1$, $t_2$ and ratio of cleaning solution recycle in percentage RR is listed as follows:

$$RR=t_2/(t_1+t_2) \tag{1}$$

Cleaning solution to dump or to recycle can be controlled by a three way valve 1015, as shown in FIG. 1E. In this case, tray 1008 can stay on one receptor 1014, and which line valve 1015 opens to determines whether the cleaning solution is drained or recycled. Here, it should be noted that the receptor for collecting the $I^{th}$ cleaning solution waste and the receptor for collecting and recycling the $I^{th}$ cleaning solution may be the same or different.

In an alternative embodiment, the number of drain outlet 1009 on tray 1008 can be more than one in order to reduce the drain time and increase drain efficiency.

Figure 3B:
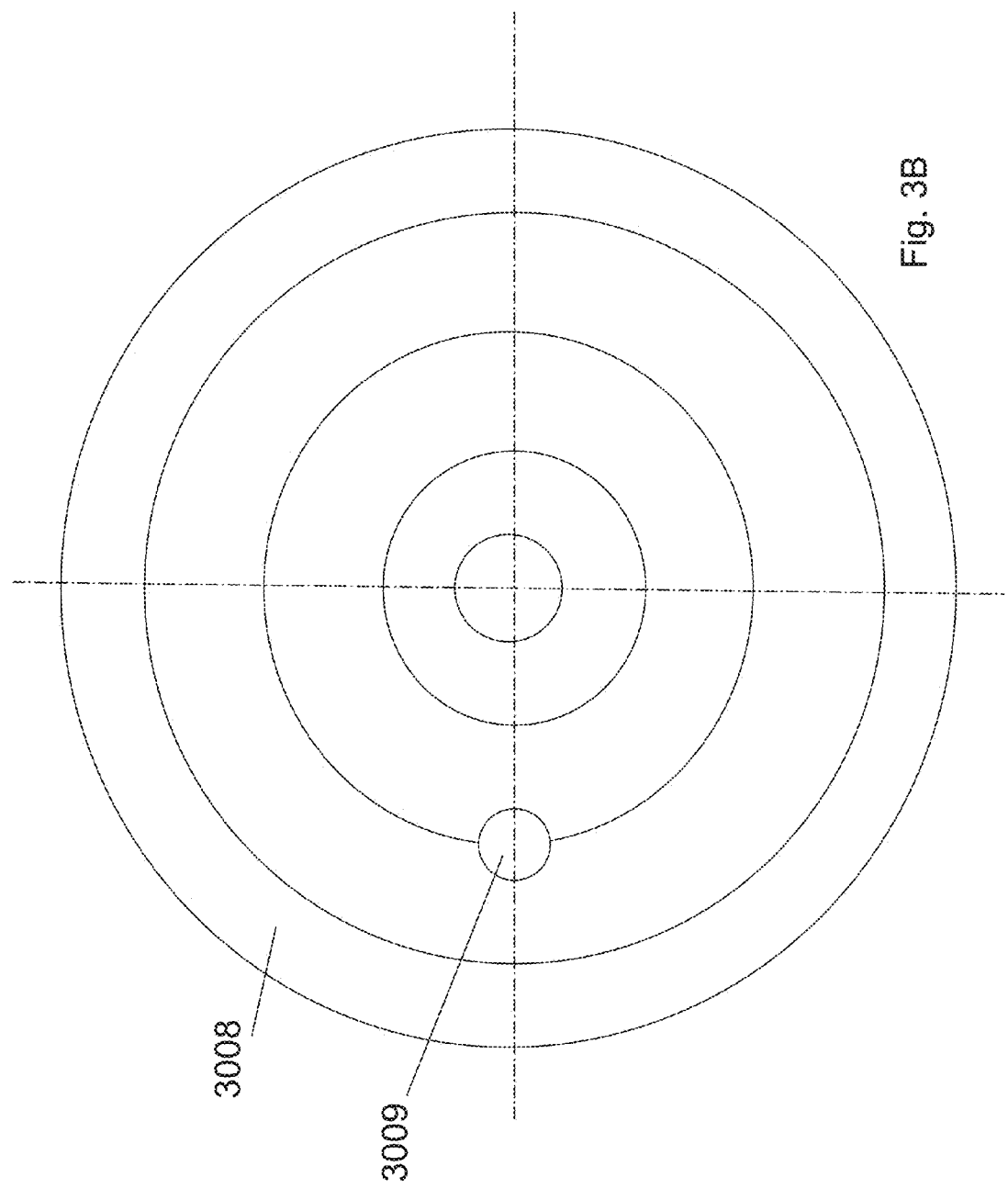

FIG. 3A-3B show another embodiment of the tray in the wafer cleaning device according to the present invention. The shape of tray 3008 is designed to have a sharp edge so that cleaning solution residual will not stay on the edge of the tray. Tray 3008 comprises a drain outlet 3009, an inner annular wing 3008B and an outer annular wing 3008A which are designed for shielding receptors from chemical cross contamination. During a rinsing cycle, the DI water may overflow to outside of tray 3008 in order to clean the side wall of tray 3008. Wings 3008A and 3008B will prevent over flown DI water from reaching the receptors The flow rate of cleaning solution may be in the range of 1 to 2 standard liters per minute (slm), the flow rate of DI water during rinsing step may be in the range of 2 to 5 slm. In order to increase the cleaning efficiency (to mix quickly with the residual cleaning solution), the temperature of DI water is set at the range of 50 to 90° C.

Tray 3008 and shroud 3006 are made of Teflon, POLYVINYLIDENE FLUORIDE, ceramics, and sapphire. The surface roughness is in the range of sub-micron or less.

In order to reduce the cleaning solution residuals on the walls of shroud 3006 and tray 3008, multiple nozzles 3028, 3026, and 3024 are positioned near the surface of shroud 3006 and tray 3008. The nozzles are connected to a clean N2 line 3006. N2 cleaning step through those nozzles can be applied after injecting each cleaning solution and after injecting DI water in the above-mentioned cleaning steps.

FIG. 4A-FIG. 4E show another embodiment of the tray in the wafer cleaning device according to the present invention. The embodiment is similar to that shown in FIGS. 3A and 3B, except that an air inflated seal 4030 and a stand 4032 are added. The air inflated seal 4030 is used for opening or closing the drain. In order to increase the cleaning efficiency and reduce cleaning time and the usage of DI water, tray 4008 is filled up with DI water first by inflating seal 4030 with pressured air (CD air). Then the DI flow is stopped or interrupted and drain outlet 4009 is opened by deflating seal 4030 with vacuum or one atmospheric pressure. Then repeat the above DI water filling up and drain steps till tray 4008 is cleaned up to a desired level.

Figure 4D:
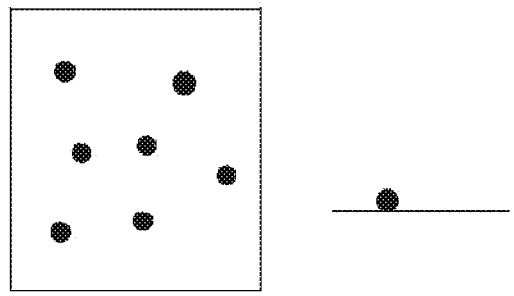
Figure 4C:
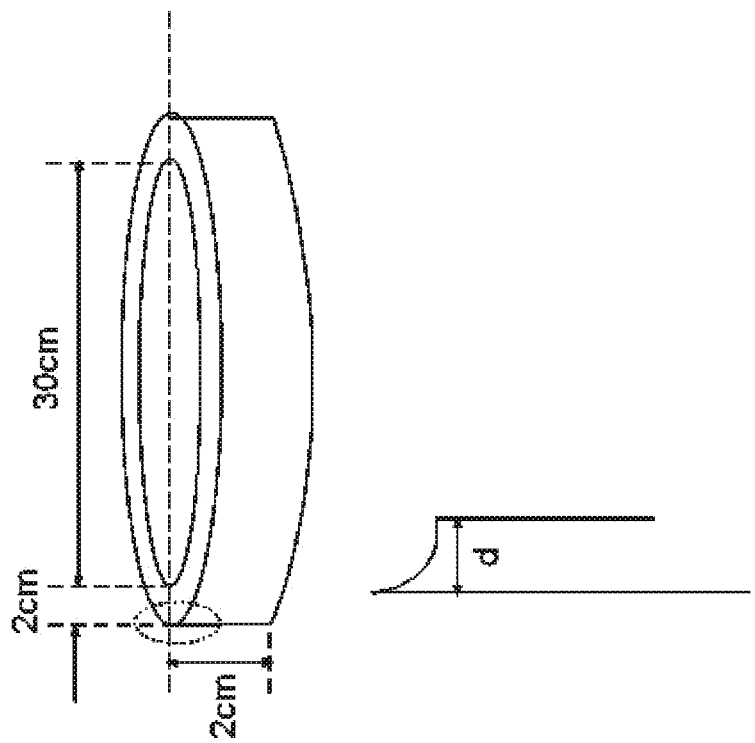

With reference to FIG. 4C and FIG. 4D, the calculation of contamination level (using $H_2SO_4$ as example of cleaning solution here) after each rinsing cycle in the above-mentioned cleaning steps is described as follows.

It should be noticed that the calculation shown below is based on the following assumptions:
1. Concentrate $H_2SO_4$ wets completely on the plastic wall of the tray (film wetting); Equilibrium thickness of the $H_2SO_4$ hanging film (curvature induced capillary force is equal to gravitational force) is used for finding out residue film thickness;
2. The drainage of $H_2SO_4$ is fast enough to reach equilibrium thickness at the end of dump;
3. Dilute $H_2SO_4$ does not wet on the plastic wall completely (droplet wetting);
4. Capillary length is used to estimate the maximum diameters of the droplets attached to the plastic wall;
5. In either case, the amount of residue liquid on the horizontal wall is twice of the residue liquid on the vertical wall, as is shown in FIG. 4D;
6. Fill process takes 5 sec to complete;
7. Drain process takes 2 sec to complete;
8. Residue liquid mixes with fresh fill liquid instantaneously;
9. Temperature of the cleaning solution and DI water is at 70° C.;
10. The shape of the tray is simplified into the likes shown in FIG. 4C.

Parameters used in the calculation as shown as follows:

| | |
|---|---|
| Outer radius of tray, cm | 17 |
| Inner radius of tray, cm | 15 |
| Height of tray, cm | 2 |
| Concentration of concentric $H_2SO_4$ | 93% wt |
| Surface tension of 93% H2SO4 at 70° C., dyns/cm | 50.76 |
| Surface tension of DI water at 70° C., dyns/cm | 64.47 |
| Density of 93% H2SO4 at 70° C., g/cm3 | 1.98 |
| Density of 93% H2O at 70° C., g/cm3 | 1 |
| Time of DI water filling up tray, sec. | 5 |
| Time of DI water draining from tray, sec. | 2 |

We first find the equilibrium thickness of the concentration H$_2$SO$_4$ wetting film.
Since $$\Delta p * A = \rho g A h, \text{ where } A = 2\pi R d$$

$$\Delta p = \frac{2\sigma}{r} = \frac{2\sigma}{d} = \rho g h$$

thickness of liquid layer, d, is $$d = \frac{2\sigma}{h\rho g}$$

total fill volume is, $$\pi(R_1^2 - R_2^2)h$$

For concentric H2SO4, total residual volume is, $$2\pi R_1 h d + 2\pi R_2 h d + \pi(R_1^2 - R_2^2)h * 2d$$

When the volume of residual H$_2$SO$_4$ is known, the concentration of H$_2$SO$_4$ after first fill and dump in the residual liquid may be calculated.

After 1st fill, Dilute H$_2$SO$_4$,

The surface is incomplete wetted and H$_2$SO$_4$ solution forms droplets on the wall and bottom, and the droplet is hemispherical in shape; we find the radius of the hemispherical drop the next:

The radius of the droplet equals to the capillary length, where $$r = \kappa^{-1} = \sqrt{\frac{\sigma}{(\rho_{liquid} - \rho_{gas})g}}$$

From the radius of residual droplets and assumed surface coverage, the volume of residual H$_2$SO$_4$ solution may be obtained. Then the concentration of residual H$_2$SO$_4$ in the droplet can be calculated.

Similar calculations can be done after each rinsing cycle, and then the concentration of residual H$_2$SO$_4$ in the droplet after each dump can be calculated.

Figure 4E:
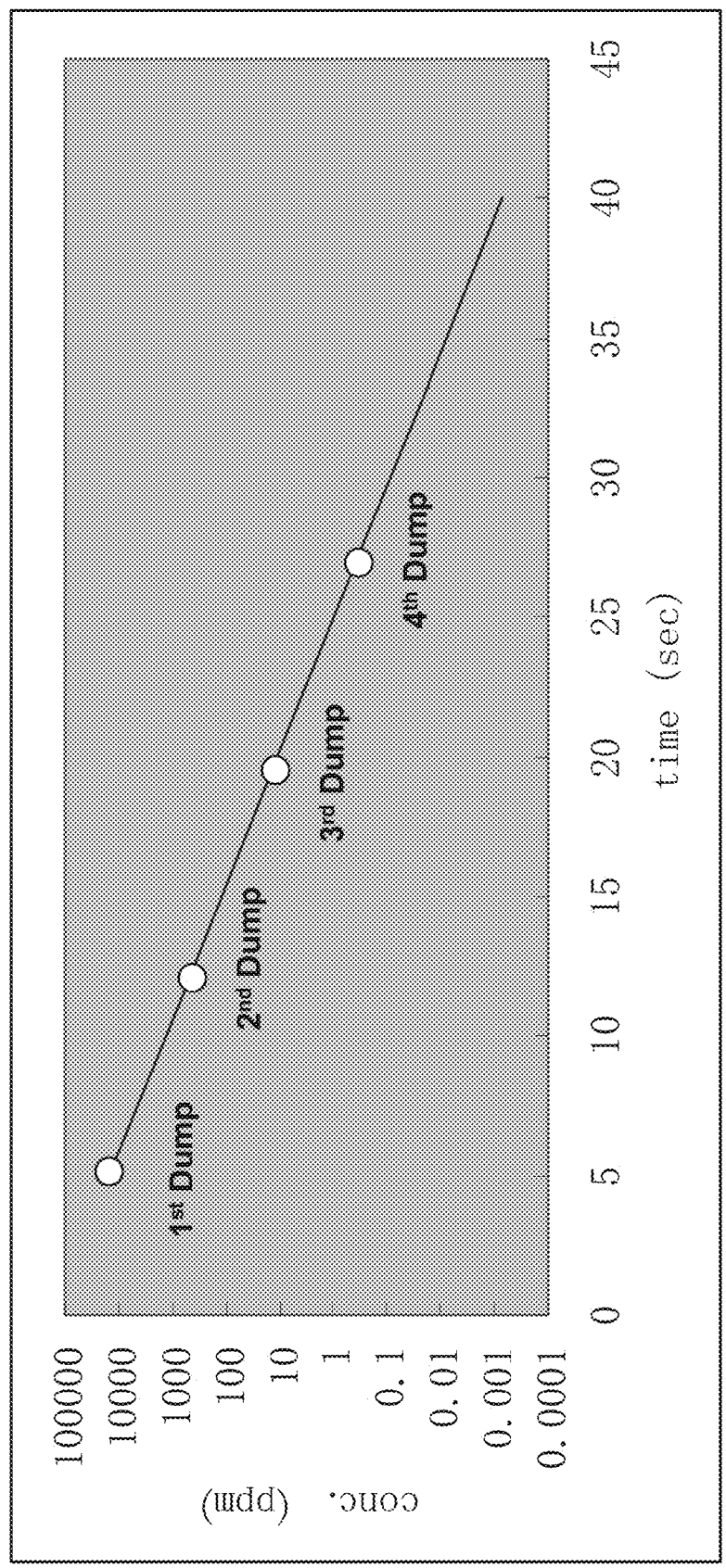

Results of after 1$^{st}$ fill and n$^{th}$ rinsing cycle are shown in FIG. 4E. It is possible to reach ppm level contamination after 4 filling and dumping cleaning cycles with total time 26 seconds.

Filling and dumping a rinsing liquid, such as DI water is regarded as a rinsing cycle. However, it should be understood for person skilled in the relevant art from the above calculation that whatever the cleaning solution is, ppm level contamination after several rinsing cycles of the abovementioned cleaning steps is possible.

It should be mentioned the drain process time is set at 2 seconds in above calculation. However, it is difficulty to drain whole rinsing water from tray 3008 in such a short time as 2 seconds by gravity method as shown in FIG. 3A. It requires a more efficient way to reduce the drain time.

FIG. 5A and FIG. 5B show another embodiment of the drain device in the cleaning device according to the present invention. The drain device comprises an air inflated seal 5034, a drain receptor 5014, a receptor outlet 5036, a pressure gas nozzle 5038, and a pressure air/vacuum switch valve 5033.

Pressure of N$_2$ directed by nozzle 5038 may be set in the range of 15 to 60 psi (pound per square inch). The working sequence of said drain device is described as follows: Rotating tray 5008 with its drain outlet 5009 directly above receptor 5014 and seal 5034. Switching valve 5033 to pressured air (or CD air). Inject DI water to wafer. Stopping inject DI water when DI water fills up tray 5008. Turning pressure N$_2$ on, it will create a vacuum effect to suck DI water out from tray quickly. Repeating the above injecting and dumping cycles as needed basis till the residual contamination reaches the required ppm value. Switching valve 5033 to vacuum, and deflating seal 5034, and rotating the tray 5008 to position the drain outlet directly above receptor for another cleaning solution.

N$_2$ pressure gas driven Ventura pump described above can be replaced by normal bellow bump, diaphragm pump, rotor pump, or metering pump. The materials of seal 5034 can be Viaton, Teflon, or any other chemical-resistive materials.

An alternative embodiment is shown in FIG. 5C. A gap is formed between drain receptor 5014 and drain outlet 5009 of tray 5008. The gap illustrated in FIG. 5C functions as a replacement of air inflated seal 5034 illustrated in FIG. 5A and has a width of 0.1 mm to 2 mm, preferably, 0.1 mm to 1 mm.

Another alternative embodiment is shown in FIG. 5D. A flexible bellow 5013 is inserted between receptor 5014 and a ring 5015. Once pressure gas nozzle 5038 opens, ring 5015 automatically raises up due to attraction force generated by air flow in the gap, and the size of the gap becomes zero, which will enhance sucking DI water out from tray quickly.

Figure 2A:
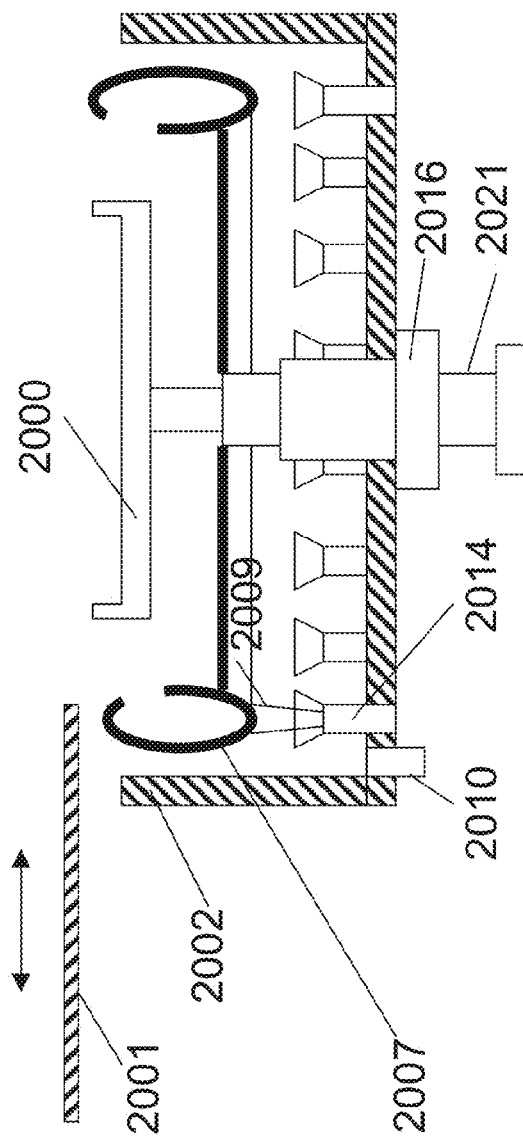
FIGS. 2A-2B depict another exemplary wafer cleaning process.
Figure 2B:
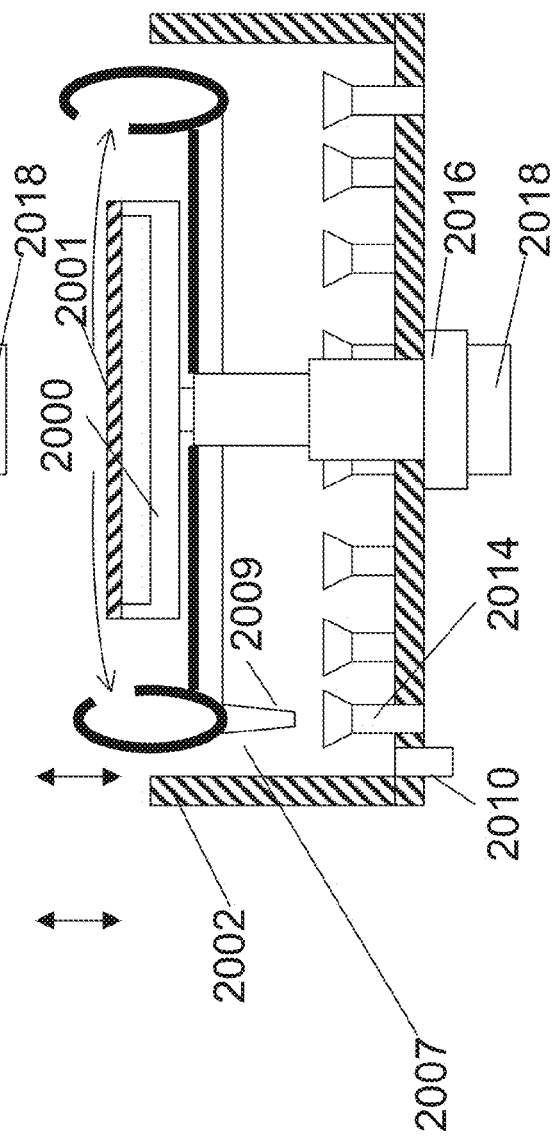

FIG. 2A-2B show another embodiment of the wafer cleaning device according to the present invention. The embodiment is similar to that shown in FIGS. 1A and 1B, except that tray 2007 can be vertically moved up and down by mechanism 2021. Before loading a wafer 2001, tray 2007 is moved to a lower position as shown in FIG. 2A. After loading wafer 2001, tray 2007 is moved to higher position for collecting cleaning solution as shown in FIG. 2B. Wafer chuck 2000 is rotated by motor 2016, and tray 2007 is rotated by motor 2018. For the numerals 2002, 2009, 2010 and 2014 in FIGS. 2A and 2B, they denote corresponding features that are denoted by 1002, 1009, 1010 and 1014, and will not be described repeatedly here.

FIG. 6A-6B show another embodiment of the wafer cleaning device according to the present invention. The embodiment is similar to that shown in FIGS. 2A and 2B, except that a wafer lifting disk 6042 driven by an actuator 6040 such as a cylinder is added. Actuator 6040 moves disk 6042 to a higher position as shown in FIG. 6A, and then a wafer 6001 is loaded onto disk 6042 by a robot (robot not shown here). Disk 6042 moves to a lower position as shown in FIG. 6B and loads wafer 6001 on chuck 6000. For the numerals 6002, 6007, 6009, 6010, 6014, 6016 and 6018 in FIGS. 6A and 6B, they denote corresponding features that are denoted by 1002, 1007, 1009, 1010, 1014, 1016 and 1018, and will not be described repeatedly here.

FIG. 7A-7B show another embodiment of the wafer cleaning device according to the present invention. The embodiment is similar to that shown in FIGS. 6A and 6B, except that a wafer chuck 7000 can be moved up and down by cylinder 7041. Cylinder 7041 moves chuck 7000 to a higher position for loading or unloading a wafer 7001 by a robot as shown in FIG. 7A, and it then moves down to a lower position for performing the wafer cleaning process as shown in FIG. 7B. For the numerals 7002, 7007, 7009, 7010, 7014, 7016 and 7018 in FIGS. 7A and 7B, they denote corresponding features that are denoted by 1002, 1007, 1009, 1010, 1014, 1016 and 1018, and will not be described repeatedly here.

FIG. 8A-8B show another embodiment of the wafer cleaning device according to the present invention. The cleaning device consists of a cleaning chamber 8002 with a drain outlet 8009, a wafer chuck 8000 driven by motor 8016, a lifting disk 8042, a cylinder 8040 to drive disk 8042 up and down, a tray 8046 with multiple receptors 8048, and a motor 8018 to rotate tray 8046. Cleaning chamber 8002 has a wall 8050 to prevent cleaning solution from being spilled out from tray 8046. An exhaust outlet 8044 is used to conduct away chemical vapor and fume. Before the first cleaning solution is applied to wafer 8001, receptor 8048 for cycling the first cleaning is moved to position directly under drain outlet 8009 of chamber 8002. Before the second cleaning solution is applied to wafer 8001, receptor 8048 for cycling the second cleaning solution is moved to position directly under drain outlet 8009 of chamber 8002. Before DI water is applied to rinsing wafer 8001, receptor 8048 for collecting waste water is moved to position directly under drain outlet 8009 of chamber 8002. Tray 8046 further consists of a drain outlet 8010 for draining cleaning solution or water being spilled outside the receptors. Receptors 8014 are connected to flexible tubes 8048 in order to handle relative movement or twist created during rotation of tray 8046. In order to minimize such a twisting movement, the rotation angle of tray 8046 is limited to less than ⅔ of turn.

In an alternative embodiment shown in FIG. 8C, inflated seal 8030 is included which has the same function as illustrated in FIG. 4A.

FIG. 9A-9B show another embodiment of the wafer cleaning device according to the present invention. The embodiment is similar to that shown in FIGS. 8A and 8B, except that tray 9046 with multiple receptors 9048 moves laterally instead of rotating, and chuck 9000 can move vertically for a robot to load and unload wafer 9001. Tray 9046 is driven into translational motion by motor 9019. The cleaning device further consists of a nozzle 9026 located inside cleaning chamber 9002. Nozzle 9026 is used for purging chemical or water residuals to drain outlet 9009. Tray 9046 further consists of a drain outlet 9010 for draining cleaning solution or water being spilled outside the receptors. Receptors 9014 are connected to flexible tube or bellow 9048 in order to handle the relative motion or twist created during translational movement of tray 9046. For the numerals 9016, 9019, 9041, 9044 and 9050 in FIGS. 9A and 9B, they denote corresponding features that are denoted by 8016, 8019, 8041, 8044 and 8050, and will not be described repeatedly here.

FIG. 10A-10B show another embodiment of the wafer cleaning device according to the present invention. The embodiment is similar to that shown in FIGS. 1A and 1B, except another tray 10004 is added for collecting another cleaning solution. Tray 10004 can be moved up and down for loading and unloading wafer 10001 by a robot. Tray 10004 is further connected to a drain by a flexible tube or bellow 10012. The purpose to add tray 10004 is to especially collect some cleaning solution which can not cross contaminate with other cleaning solutions in ppb (part per billion) level, such as HF cleaning solution. When tray 10004 is used, the shroud 10006 is moved to a lower position to cover tray 10008. Chuck 1000 rotates by a speed of 50-500 rpm so that the cleaning solution applied into the wafer 1001 will be radially thrown out into tray 10004. For the numerals 10002, 10007, 10009, 10010, 10014, 10016 and 10018 in FIGS. 10A and 10B, they denote corresponding features that are denoted by 1002, 1007, 1009, 1010, 1014, 1016 and 1018, and will not be described repeatedly here.

FIG. 11A-11B show another embodiment of the wafer cleaning device according to the present invention. The embodiment is similar to that shown in FIGS. 2A and 2B, except another tray 11004 is added for collecting another cleaning solution. Tray 11004 can be moved up and down for loading and unloading wafer 11001. Tray 11004 is further connected to a drain by a flexible tube or bellow 11012. The purpose for adding tray 11004 is to specifically collect cleaning solution that contains chemicals which must not be cross-contaminated by other cleaning solution even at ppb (part per billion) level, such as HF solution. When tray 11004 is used, the tray 11007 is moved to a lower position to avoid cleaning solution cross contamination. For the numerals 11002, 11007, 11009, 11010, 11014, 11016 and 11018 in FIGS. 11A and 11B, they denote corresponding features that are denoted by 1002, 1007, 1009, 1010, 1014, 1016 and 1018, and will not be described repeatedly here.

Figure 12B:
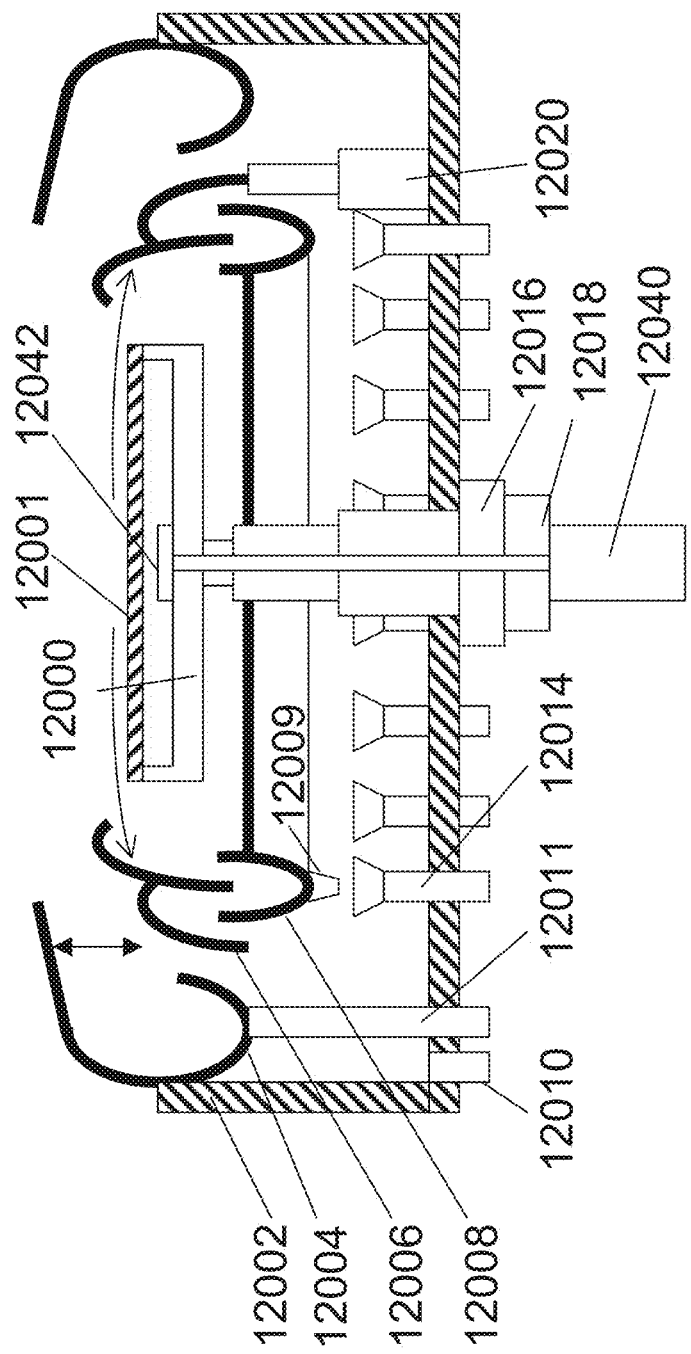

FIG. 12A-12B show another embodiment of the wafer cleaning device according to the present invention. The embodiment is similar to that shown in FIGS. 1A and 1B, except another stationary tray 12004 is added for collecting another cleaning solution, and a lifting disk 12042 is added, together with a chuck 12000. Tray 12004 is connected to a drain outlet by pipe 12011. Disk 12042 moves up and down for loading and unloading wafer 12001 to chuck 12000. The purpose for adding tray 12004 is to specifically collect some cleaning solution that contains chemicals which must not be cross-contaminated by other cleaning solution even at ppb (part per billion) level, such as HF cleaning solution. When tray 12004 is collecting a cleaning solution, the shroud 12006 moved to a lower position to cover tray 12008. For the numerals 12002, 12007, 12009, 12010, 12014, 12016 and 12018 in FIGS. 12A and 12B, they denote corresponding features that are denoted by 1002, 1007, 1009, 1010, 1014, 1016 and 1018, and will not be described repeatedly here.

Figure 13A:
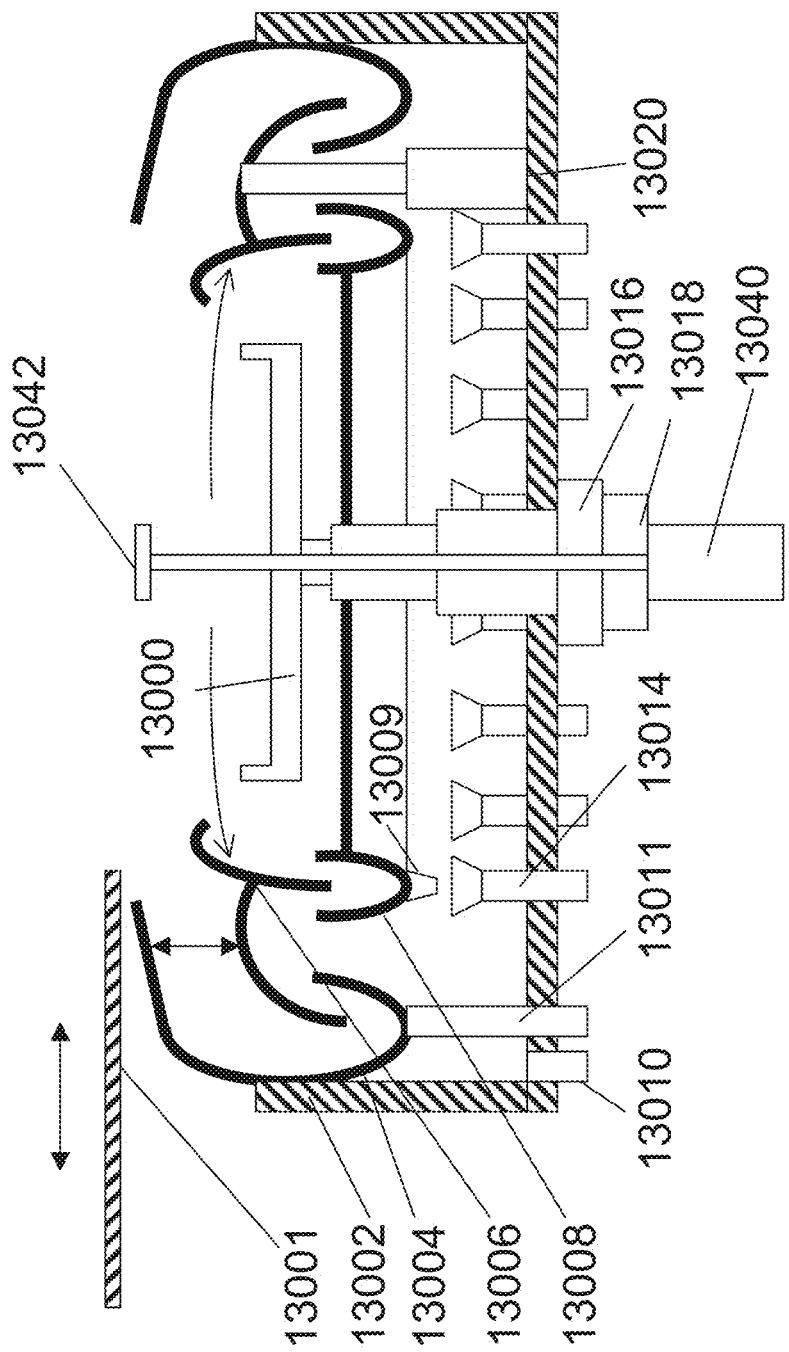
FIGS. 13A-13B depict another exemplary wafer cleaning device.
Figure 13B:
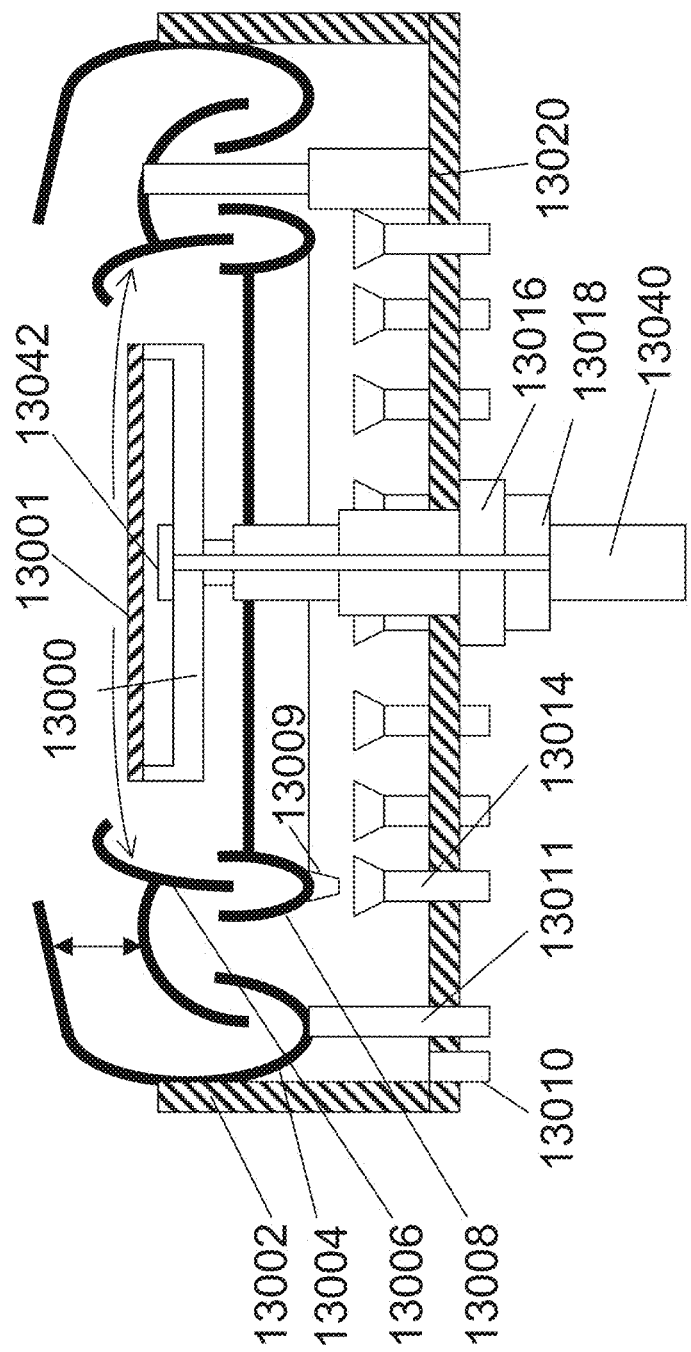

FIG. 13A-13B show another embodiment of the wafer cleaning device according to the present invention. The embodiment is similar to that shown in FIGS. 12A and 12B, except shroud 1306 is designed to cover both tray 1308 and portion of stationary tray 13004. When shroud 13006 is in a lower position, the cleaning solution spinning out of wafer 13001 will be mainly collected by stationary tray 13004, and portion of the cleaning solution landed on outside surface of shroud 13006 will flow down to stationary tray 13004. For the numerals 13002, 13007, 13009, 13010, 13014, 13016 and 13018 in FIGS. 13A and 13B, they denote corresponding features that are denoted by 1002, 1007, 1009, 1010, 1014, 1016 and 1018, and will not be described repeatedly here.

Although the present invention has been described with respect to certain embodiments, examples, and applications, it will be apparent to those skilled in the art that various modifications and changes may be made without departing from the invention. For example, the number of drain outlets in the rotation tray can be more than one in order to increase the efficiency of drain or reduce drain time.

What is claimed is:
1. An apparatus for cleaning semiconductor substrate comprising:
   a chuck to hold a semiconductor substrate;
   a rotating means to drive said chuck;
   a chamber with at least one drain outlet;
   a plate having at least one receptor placed under the said chamber;
   a moving means to drive said plate so as to align the receptor with the drain outlet.

2. The apparatus of claim 1, wherein said moving means is a rotating mechanism to drive said plate to rotate around an axis.

3. The apparatus of claim 1, wherein said moving means is a translational motion mechanism to drive said plate to move laterally.

4. The apparatus of claim 1, wherein said chuck further comprises a vertically moving disk, said disk is moved to a first position to load or unload the semiconductor substrate, and to a second position to put the semiconductor substrate on or take it off said chuck.

5. The apparatus of claim 1, wherein said apparatus further comprises a vertically moving mechanism to drive said chuck to a first position for loading or unloading the semiconductor substrate, and to a second position to perform cleaning or conditioning process.

6. The apparatus of claim 1, wherein said tray comprises at least one nitrogen nozzle to purge the used cleaning solution away from surface of said chamber.

7. The apparatus of claim 1, wherein further comprising an air inflated ball seal placed under the drain outlet of said chamber to open or close the drain for disposing the used cleaning solution from said chamber.

8. The apparatus of claim 1, wherein further comprising an air inflated donuts seal placed between the drain outlet of the chamber and the receptor on said plate.

9. The apparatus of claim 1, wherein said drain outlet further comprises a pump to suck the used cleaning solution away quickly from said chamber.

* * * * *